United States Patent
Khandros et al.

(10) Patent No.: US 6,330,164 B1
(45) Date of Patent: Dec. 11, 2001

(54) INTERCONNECT ASSEMBLIES AND METHODS INCLUDING ANCILLARY ELECTRONIC COMPONENT CONNECTED IN IMMEDIATE PROXIMITY OF SEMICONDUCTOR DEVICE

(75) Inventors: Igor Y. Khandros, Orinda; David V. Pedersen, Scotts Valley; Benjamin N. Eldridge; Richard S. Roy, both of Danville; Gaetan Mathieu, Livermore, all of CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/114,589

(22) Filed: Jul. 13, 1998

Related U.S. Application Data

(60) Continuation-in-part of application No. 08/340,144, filed on Nov. 15, 1994, now Pat. No. 5,917,707, and a continuation-in-part of application No. 08/558,332, filed on Nov. 15, 1995, now Pat. No. 5,829,128, and a continuation-in-part of application No. 08/955,001, filed on Oct. 20, 1997, now Pat. No. 6,043,563, and a continuation-in-part of application No. 08/457,479, filed on Jun. 1, 1995, now Pat. No. 6,049,976, which is a division of application No. 08/152,812, filed on Nov. 16, 1993, now Pat. No. 5,476,211, and a continuation-in-part of application No. 09/107,924, filed on Jun. 30, 1998, which is a division of application No. 08/533,584, filed on Oct. 18, 1985, now Pat. No. 5,772,451.

(51) Int. Cl.[7] .................................................. H05K 7/02

(52) U.S. Cl. ................... 361/760; 361/734; 361/738; 361/767; 361/769; 361/770; 361/773; 361/774; 361/783; 361/787; 361/804; 257/724; 439/69

(58) Field of Search ...................................... 361/734, 738, 361/767–770, 772–774, 760, 763, 782, 783, 787, 790, 792–795, 803, 804; 257/723, 724, 777; 439/69

(56) References Cited

U.S. PATENT DOCUMENTS

| | | | |
|---|---|---|---|
| 4,074,342 | * | 2/1978 | Honn et al. ........................ 361/783 |
| 4,451,845 | * | 5/1984 | Philofsky et al. ................. 257/724 |

(List continued on next page.)

Primary Examiner—Jeffrey Gaffin
Assistant Examiner—John B. Vigushin
(74) Attorney, Agent, or Firm—Blakely, Sokoloff, Taylor & Zafman

(57) ABSTRACT

The present invention provides an ancillary electrical component in very close proximity to a semiconductor device, preferably mounted directly to the semiconductor device. In one preferred embodiment, the ancillary electrical component is a capacitor. In a preferred embodiment, a terminal is provided on the semiconductor device such that the capacitor can be electrically connected directly to the terminals, as by soldering or with conductive epoxy. Connecting the capacitor between terminals of a power loop provides superior noise and transient suppression. The very short path between the capacitor and the active circuit provides for extremely low inductance, allowing for the use of relatively small capacitors. The semiconductor device then is connected to an electronic device such as a PC board for further connection to other circuitry. One particularly preferred mode of connection is by incorporating resilient, free-standing contact structures on the same semiconductor device, with the structures standing farther away from the semiconductor and the capacitor. Other useful connectors include providing similar resilient, free-standing contact structures on the other device, then positioning the semiconductor over the resilient contacts and securing the two devices together. A socket with such resilient structures is particularly useful for this application. In an alternative preferred embodiment, the capacitor and resilient contacts all are incorporated in the second device, such as a socket. In one aspect of the invention, the ancillary electrical component may include a travel stop structure which defines a minimum separation between the semiconductor and a substrate such as a printed circuit board.

41 Claims, 19 Drawing Sheets

U.S. PATENT DOCUMENTS

| | | | | |
|---|---|---|---|---|
| 4,734,818 | * | 3/1988 | Hernandez et al. | 361/768 |
| 5,032,896 | * | 7/1991 | Little et al. | 361/787 |
| 5,067,007 | * | 11/1991 | Kanji et al. | 257/692 |
| 5,128,831 | * | 7/1992 | Fox, III et al. | 439/69 |
| 5,198,963 | * | 3/1993 | Gupta et al. | 257/777 |
| 5,220,200 | * | 6/1993 | Blanton | 257/778 |
| 5,234,204 | * | 8/1993 | Val | 257/724 |
| 5,274,270 | * | 12/1993 | Tuckerman | 257/777 |
| 5,309,324 | * | 5/1994 | Hernandez et al. | 361/734 |
| 5,317,479 | * | 5/1994 | Pai et al. | 361/773 |
| 5,371,654 | * | 12/1994 | Beaman et al. | 361/792 |
| 5,434,453 | * | 7/1995 | Yamamoto et al. | 257/777 |
| 5,446,309 | * | 8/1995 | Adachi et al. | 257/777 |
| 5,495,395 | * | 2/1996 | Yoneda et al. | 361/787 |
| 5,510,758 | * | 4/1996 | Fujita et al. | 361/795 |
| 5,650,920 | * | 7/1997 | Pfizenmayer | 361/782 |
| 5,780,930 | * | 7/1998 | Malladi et al. | 257/777 |
| 5,790,384 | * | 8/1998 | Ahmad et al. | 361/767 |
| 5,793,115 | * | 8/1998 | Zavracky et al. | 257/777 |
| 5,854,434 | * | 12/1998 | Beilin et al. | 257/723 |
| 5,969,953 | * | 10/1999 | Purdom et al. | 361/804 |

* cited by examiner

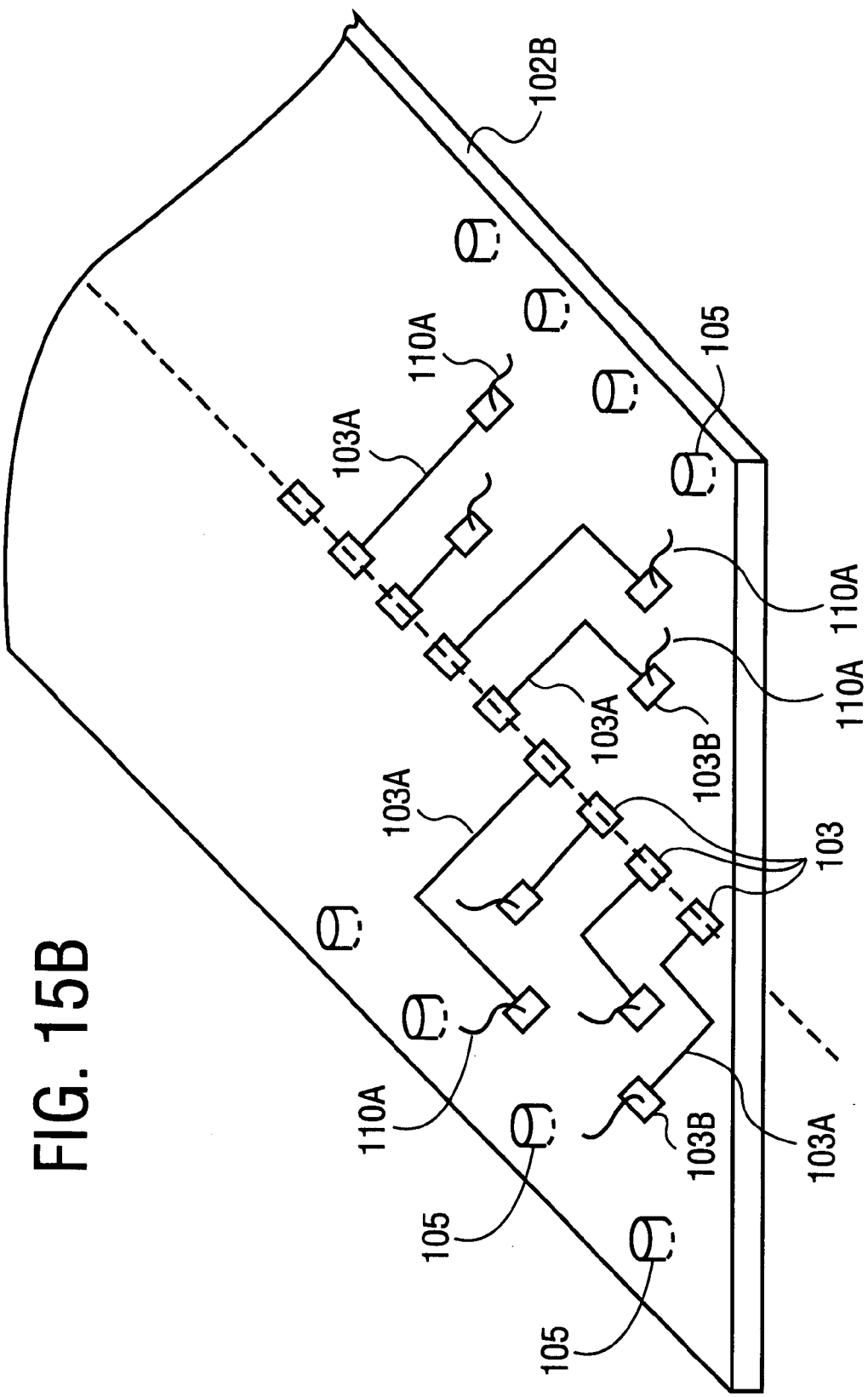

INTERCONNECT ASSEMBLIES AND METHODS INCLUDING ANCILLARY ELECTRONIC COMPONENT CONNECTED IN IMMEDIATE PROXIMITY OF SEMICONDUCTOR DEVICE

CROSS REFERENCES TO RELATED APPLICATIONS

This application is a continuation-in-part of application Ser. No. 08/340,144, filed Nov. 15, 1994, which issued as U.S. Pat. No. 5,917,707 and entitled "Contact Structure for Interconnections, Interposer, Semiconductor Assembly", inventors Khandros and Mathieu, commonly assigned with the present application. This application also is a continuation in part of a co-pending, commonly assigned patent application Ser. No. 09/107,924, filed Jun. 30, 1998 by inventors Khandros, Mathieu, Eldridge, Grube and Dozier, which application is a divisional of U.S. patent application Ser. No. 08/533,584, filed Oct. 18, 1995 which issued as U.S. Pat. No. 5,772,451. This application also is a continuation in part of, commonly assigned application Ser. No. 08/955,001, filed Oct. 20, 1997, which issued as U.S. Pat. No. 6,043,563 and is entitled "Electronic Component With Terminals And Spring Contact Elements Extending From Areas Which Are Remote From The Terminals", inventors Eldridge, Khandros, Mathieu, and Pedersen. This application is also a continuation-in-part of application Ser. No. 08/457,479, filed Jun. 1, 1995 which issued as U.S. Pat. No. 6,049,976 and is a divisional application from the application Ser. No. 08/152,812, filed Nov. 16, 1993, which issued as U.S. Pat. No. 5,476,211. This application is also a continuation-in-part of U.S. patent application Ser. No. 08/558,332, filed Nov. 15, 1995, issued as U.S. Pat. No. 5,829,128, and is entitled "Method of Mounting Resilient Contact Structures to Semiconductor Devices" by Eldridge et al., which is incorporated by reference herein.

FIELD OF THE INVENTION

This invention relates to positioning a small electronic component on or very close to a semiconductor device. More particularly, one aspect of this invention is directed to the field of decoupling capacitors for semiconductor devices mounted in systems. Resistors and other electronic components can be used as well and the invention may be use for improved electrical performance. Other aspects of the invention relate to techniques and assemblies for making electrical interconnections to contact elements on a semiconductor device, such as an IC, in either a temporary (e.g. in test and/or burn-in procedures) or permanent manner.

BACKGROUND OF THE INVENTION

Semiconductor devices operate best where the power supply voltages are very stable, with few if any transients. In a typical system for semiconductor devices, Vss and Vdd are supplied using a well regulated and stable power supply. These levels are important as the absolute levels of each affect many aspects of the operation of various active devices in a semiconductor circuit. For example, the pre-charge of a transistor in a memory circuit depends on the levels of each of Vss and Vdd. In addition, the difference between Vss and Vdd impacts the speed of a device. Transient variations in the power levels can dynamically change the delay through circuit elements. For logic circuits, this can slow down operation of the circuit, decreasing the frequency of operation. In a phase locked loop (PLL), these power level transients are a primary source of jitter.

Despite the efforts of designers to limit transients in the power supply to individual integrated circuits (ICs) in a system, it is nearly impossible to preclude all such transients. Transients or noise may arise from other sources such as cross talk between different levels or signals. It is common to include a capacitor between Vdd and Vss or between Vdd and ground in the region of an IC to provide some amount of transient filtering. This will suppress spikes and reduce sensitivity to noise.

This is particularly common in memory modules, where a capacitor may be wired to each IC, or to a small number of equivalent ICs. A typical SIMM (single in-line memory module) or DIMM (dual in-line memory module) will have several small capacitors wired onto a printed circuit (PC) board for this purpose. Referring to FIG. 1, in a representative memory module with PC board 10, memory chips 12 are connected by traces (not shown) to edge connector fingers 13. These traces supply Vss, Vdd, ground, address, data and control signals to each IC such as memory chip 12. A bypass capacitor 11 is connected by traces 14 to Vss and Vdd of a corresponding memory chip 12.

It is advantageous to position the bypass capacitor as close to the corresponding IC device as possible. A long trace between an IC and a bypass capacitor has inherent inductance and resistance, and the effect of this parasitic inductance and resistance is more pronounced at higher frequencies. To improve the filtering, a lower trace length or larger capacitance can be designed into a circuit. For a given capacitor, the effective noise suppression is approximately inversely related to the trace length. For example, if the trace length between the capacitor and the IC can be reduced by a third, the capacitor will be approximately three times more effective in reducing noise. Thus, by positioning a capacitor closer to an IC (e.g. a memory IC), a smaller inductance is achieved, which means that a smaller capacitor can be used to achieve the same amount of filtering as a larger capacitor positioned farther away (and thus having a higher inductance).

Typical memory chips are packaged in a variety of materials, generally plastic or ceramic, with leads extending outside the package. The present trend in packaging for higher interconnect density is towards Ball Grid Array (BGA) packages, where the PC board connections are closely spaced in a grid underneath the middle of the chip's package. These leads are soldered to corresponding terminals on the printed circuit board of a module or motherboard, with the package essentially flush with the PC board. The designer will position a bypass capacitor as close as convenient, but restrictions include the proximity of other devices such as other ICs, and the location and routing of other traces. In a multilayer board, quite common in modern designs, the connection to the bypass capacitor will be at least millimeters and often centimeters in length.

Recent advances in chip packaging now permit a semiconductor die to be positioned a short distance away from the corresponding PC board, module, or other connection device. In particular, the use of small spring structures such as MicroSpring™ contact structures using FormFactor technology, positions the IC on the order of 20 mils (500 microns or 0.5 mm) above the PC board. Construction of suitable devices is described in detail in U.S. patent application Ser. No. 08/340,144, filed Nov. 15, 1994, entitled "Contact Structure for Interconnections, Interposer, Semiconductor Assembly", inventors Igor Y. Khandros and Gaetan L. Mathieu, (hereinafter the "Parent" case). That application is incorporated herein by reference in its entirety. The corresponding PCT application was published May 26, 1995 as WO 95/14314.

In the Parent case, FIG. 32 illustrates a capacitor positioned between a semiconductor device and a support PC board. An alternative description of making spring members can be found in U.S. patent application Ser. No. 08/526,246, filed Sep. 21, 1995, entitled "Composite Interconnection Elements for Microelectronic Components and Methods of Making Same", commonly assigned with the present application. The corresponding PCT application was published May 30, 1996 as WO 96/16440. These disclosures detail bonding a flexible material to an electronic component such as a semiconductor device, forming it into a springable shape, then coating it with a hard material to form a resilient, free-standing electrical contact structure. Such resilient contacts preferably extend some 20 to 40 mils from the surface of a semiconductor wafer. The resilient contact can be connected to terminals on a second electronic component such as a PC board in a variety of ways, such as by soldering.

Referring to FIG. 2, memory chip 12 includes terminals 23 which are often bonding pads on a passivated surface of the IC. For many of the terminals 23, a resilient contact 21 is bonded to the terminal as described in the parent application and in the '246 application. Each resilient contact has a free end that is positioned to mate with a corresponding terminal 22 on PC board 10. The resilient contact may be connected to the terminal 22 by soldering, brazing, conductive epoxy and the like (not shown). Alternatively, the resilient contact may be brought into pressure contact with the corresponding terminal, then secured in place reversibly, as in a socket or clamp, or secured permanently, as with potting compound, which may fully engulf and surround the memory chip 12.

Two terminals 23A are provided to connect bypass capacitor 11 by means of capacitor contacts 11A. In FIG. 32 of the Parent application a similar structure is shown with the capacitor connected to the PC board, not the semiconductor. The resilient contact elements are shown connected to the semiconductor device but could have been secured to the PC board or other suitable substrate and then later connected to the semiconductor device. Each of these general embodiments are useful. Where the capacitor can fit between the semiconductor device and the corresponding mating component, such as a PC board, contact elements can be secured to the semiconductor device or the mating component, or even to each. It will be appreciated that chip 12 may be some type of IC other than a memory chip.

Referring to FIG. 3, FIG. 2 is seen to be a cross-section slice taken along line 2—2. FIG. 3 is a cross section, plan view of semiconductor device 12 over PC board 10, with the contact elements (terminals 23) on the bottom of semiconductor device 12 shown in solid lines for clarity. See line 3—3 in FIG. 2. In this embodiment, terminals 22 on PC board 10 are shown to be offset in X and Y from terminals 23 according to the shape of resilient contacts 21. However the particular offset of the terminals and the shape and dimensions of a contact terminal may be selected in coordination according a number of design criteria by one skilled in the art. For example, balls are generally spherical, so corresponding terminals would be positioned in very close proximity. However, using the shapeable resilient contact elements described above, the vector between base and contact region can be varied significantly, allowing for considerable flexibility in the relative placement of terminals on the semiconductor and mating component.

The position where a terminal is laid out on a semiconductor is selected according to various design criteria. A typical semiconductor device is designed for the intended final packaging. The traditional structure is a peripheral array, with contact terminals arranged along or near the periphery of the active circuitry. Another traditional structure is lead-on-center or LOC, where the terminals are along a line approximately bisecting the active circuitry. Some devices are prepared for connection as an area array, generally regularly spaced over much of the area of the active circuit. Concentration of terminals in a region of the chip allows for the association of specialized circuitry for interfacing through terminals, such as buffering, I/O control, and ESD protection.

The position of the base of a resilient contact element on a semiconductor device can be varied with significant freedom. Referring to co-pending, commonly assigned priority application Ser. No. 08/955,001, filed Oct. 20, 1997, entitled "Electronic Component With Terminals And Spring Contact Elements Extending From Areas Which Are Remote From The Terminals," a product is described for creating a resilient contact base at some distance from the original semiconductor terminal, and creating a resilient contact at that remote location. That application is incorporated herein by reference in its entirety. Of course, a resilient contact can be fabricated just at the terminal as well.

A device designed with a primary terminal layout pattern can be remapped to a second terminal layout pattern, preferably using the method described in that application Ser. No. 08/955,001 disclosure. Depending on the design of the contact structures, a third layout pattern may pertain to the contact region of the contact structures. In one preferred example, a peripheral pad array, or a LOC array, can be modified to an area array. Among other advantages, this generally provides for a greater pitch between contact elements as compared with the original pad layout. It is preferred that the area array pitch is compatible with PC board design rules. Thus, using the resilient contact structures of the invention, a semiconductor device can be connected directly to a PC board.

Before the present invention, there was no way to position a capacitor or other electrical element directly between a semiconductor device and a second electronic component, in the context of chip scale packaging. Because the capacitor could be positioned only nearby, the necessary trace length required that larger capacitors be specified, thus preventing any attempts to position the capacitor directly at the semiconductor—component interface.

These same limitations pertain to the incorporation of other electronic components in the immediate proximity of a semiconductor device. Circuits frequently call for the inclusion of a pull-up or pull-down resistor. Such devices often are provided in a substrate such as a PC board nearby the active device, but the position of such a resistor will impact signal fidelity on the relevant signals. Placing such a resistor in the immediate proximity of a semiconductor would provide significant advantages. Other circuit elements also could be connected very close to a semiconductor device if the circuit element is sufficiently small and the semiconductor device is packaged to provide sufficient room for this connection.

SUMMARY OF THE INVENTION

One aspect of the present invention provides a semiconductor assembly comprising a semiconductor integrated circuit (IC) and a first circuit element. The IC has interconnection pads fabricated on a surface of the IC and has an insulating layer which exposes the interconnection pads. The first circuit element is disposed in a structure which is attached to the surface of the IC and which is electrically coupled to a second circuit element in the IC.

The present invention also provides, in another embodiment, an electronic component in very close proximity to a semiconductor device, preferably mounted directly to the semiconductor device. One preferred example of such an electronic component is a bypass capacitor. In a preferred embodiment, a terminal is provided on the semiconductor device such that the capacitor can be electrically connected directly to the terminals, as by soldering or with conductive epoxy. Connecting the capacitor between terminals of a power loop provides superior noise and transient suppression. The very short path between the capacitor and the active circuit provides for extremely low parasitic inductance and resistance, allowing for the use of relatively small capacitors or conversely for more effective noise suppression for a given capacitor size. Another preferred ancillary electronic component is a resistor, where short path lengths allow for better signal fidelity. The semiconductor device then is connected to an electronic device such as a PC board for further connection to other circuitry. One particularly preferred mode of connection is by incorporating resilient, free standing contact structures on the same semiconductor device, with the structures extending from the semiconductor device farther than the ancillary electronic component. Other useful connectors include providing similar resilient, free-standing contact structures on the other device, then positioning the semiconductor over the resilient contacts and securing the two devices together. A socket with such resilient structures is particularly useful for this application. In an alternative preferred embodiment, the capacitor and resilient contacts all are incorporated in the second device, such as a socket.

A semiconductor device may be coupled with various other devices in a similar manner. In particular, a second semiconductor device (e.g., a second IC) may be fitted partially or completely within a space between the primary device and a mating component.

The present invention is useful with a variety of contact structures. The preferred contact structure is a resilient, free standing member with sufficient height to incorporate the ancillary component between the primary device and the mating component. Another useful contact structure is a C4 ball of sufficient diameter to incorporate the ancillary component in the selected space.

In another aspect of the present invention, the ancillary electrical component is housed in a structure between a surface of an IC and another substrate, which structure functions as a travel stop structure. This travel stop structure is used to define a minimum separation between the surface of the IC and the another substrate. The IC typically includes a plurality of contact elements on its surface, which contact elements are electrically interconnected to contact elements on the surface of the another substrate, and these surfaces face each other and are generally planar, creating a space between the surfaces. The respective contact elements on the two surfaces may be electrically interconnected by a resilient contact element, such as a resilient free-standing contact structure which has at least a portion thereof which is capable of moving to a first position. The travel stop structure which includes the ancillary electrical component defines the first position in which the resilient contact element is in electrical and mechanical contact with its corresponding contact element.

These and other aspects and advantages of the invention, as well as the details of an illustrative embodiment, will be more fully understood from the following specification and drawings.

BRIEF DESCRIPTION OF THE DRAWINGS

The present invention is illustrated by way of example and not limitation in the figures of the accompanying drawings in which like references indicate similar elements.

FIG. 8A is stylized to show the separate physical components while FIG. 8B illustrates one useful way of connecting the components.

FIG. 15B shows a perspective view of an embodiment of the invention in which resilient contact elements are disposed with a fan-out on a substrate with stop structures.

DESCRIPTION OF THE PREFERRED EMBODIMENTS

Figure 1:
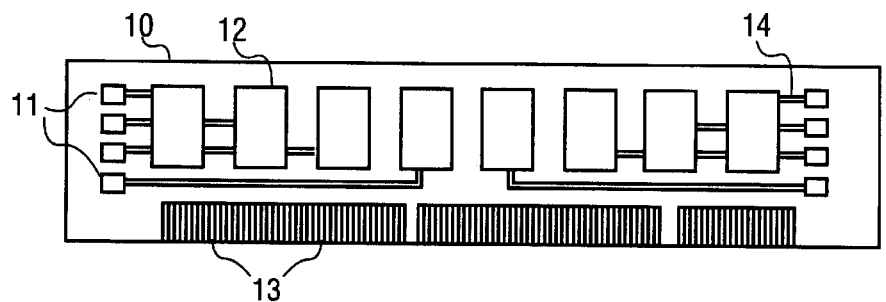
FIG. 1 illustrates a top, plan view memory module of the prior art.

One aspect of the present invention relates to interconnection assemblies and methods and particularly to interconnect assemblies having an electrical component closely positioned to a semiconductor device. The following description and drawings are illustrative of the invention and are not to be construed as limiting the present invention. Numerous specific details are described to provide a thorough understanding of the present invention. However, in certain instances, well known or conventional details are not described in order to not unnecessarily obscure the present invention.

The general concept of securing a capacitor between a semiconductor and a PC board was mentioned in the Parent application, as discussed in the background section above. This is useful if the contacts on a semiconductor happen to be in a convenient position for connecting such a device to a semiconductor. However, a typical semiconductor designer is faced with many design constraints and generally will do very little to accommodate the needs of a specific packaging method. Earlier packaging provided almost no space between a package and the associated PC board (or other receiving element). Capacitors with sufficient capacitance for a noticeable reduction of Vdd transients were not small. Before the invention of the present resilient contacts, there was no incentive to design such a semiconductor anyway, as there was essentially no way to position a large enough capacitor in the available space. However, with the present invention, a closely positioned capacitor which is small can be positioned in such space and yet have sufficient capacitance due to the reduced parasitic inductance and resistance resulting from the close positioning.

This concept can be extended to a variety of structures that can be summarized generally as selecting an ancillary electronic component which can be fitted between a primary component and a mating component. A preferred primary component is a semiconductor device (e.g. an IC), fitting one or more thin electronic components (e.g. a capacitor, a resistor, an inductor, an IC such as a cache memory IC or a clock oscillator IC or other electrical component or several of each of these or combinations of these components) in a space between the primary component and a mating component. A preferred contact is a resilient, free-standing contact element as described above. Other contacts such as C4 balls are useful as well. Some of the space between the primary component and the mating component may be established by terminals of varying height, even extending the "height" of the ancillary component, although it is generally preferred that the contact determine much of the available space. The scale of the ancillary device preferably is "chip scale", that is suitable for use with a typical memory chip, microprocessor or other IC such as an ASIC. Note however, that suitable devices may be relatively large, as in the instance of a full-wafer contactor. Here the horizontal dimension of the primary component may be a disk having a diameter of about 31 cm, mating to a substrate which might be a PC board or another 31 centimeter disk, for example, but the distance between the primary component and the mating component is on the order of the spacing for connecting a semiconductor device to a support. Typically this height is on the order of 40 to 250 mils (1.0 to 6.25 mm) but can be 20 mils (500 microns) or smaller.

The resilient contacts as described above can be made in a variety of shapes and sizes. In a preferred form, the contact extends from the surface of the semiconductor (or other substrate) some 35–40 mils (875–1000 microns=0.88–1 mm). Capacitors are commercially available from Novacap (Valencia, Calif.) that are 50×80×20 mils, 29 nanofarads. Other useful capacitors can be as small as 20×40×20 mils (e.g. a 10 nf capacitor from AVX Olean Advanced Products Division, 1002 Seneca Avenue, Olean, N.Y. 14760). This is a useful amount of capacitance if the capacitor can be positioned quite close to the active circuit. The 20 mil height means that the capacitor can easily fit within the height of the resilient contacts.

Figure 2:
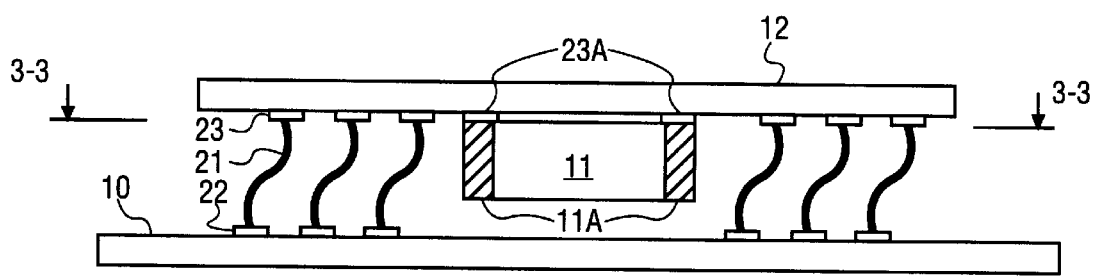
FIG. 2 illustrates a thin cross section, taken from FIG. 3 as shown, of a semiconductor device mounted to a PC board or other substrate.
Figure 3:
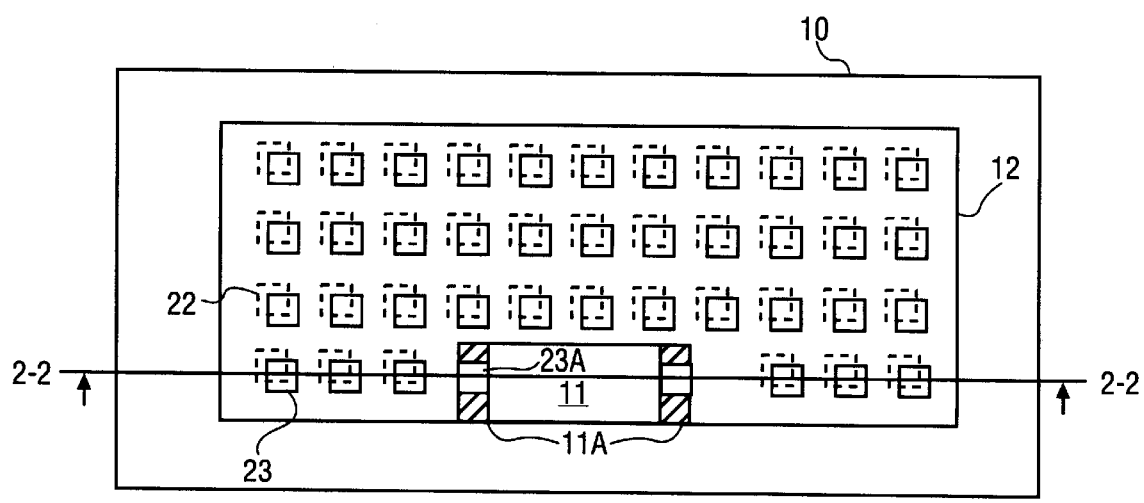
FIG. 3 is a top plan view of a semiconductor device mounted to a PC board, here illustrated as a portion of a memory module.
Figure 6:
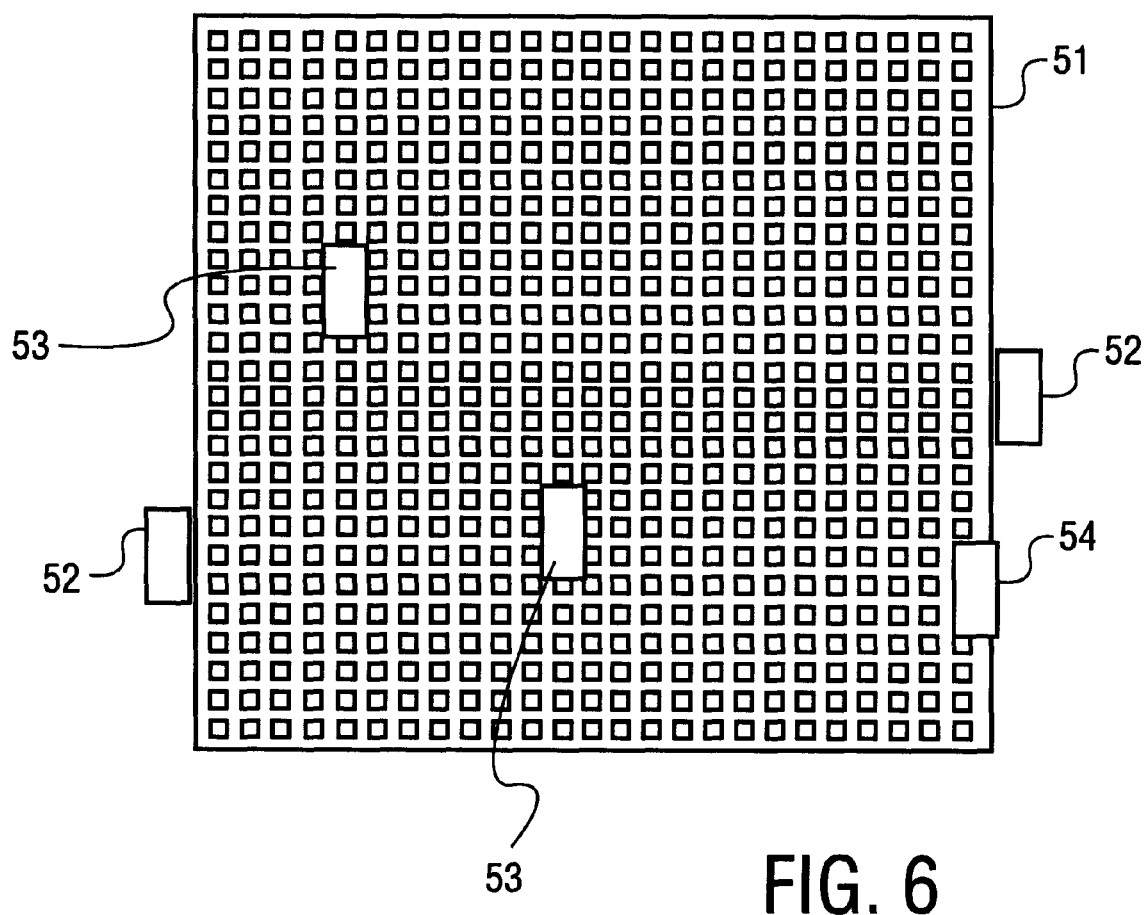
FIG. 6 illustrates a top view of a representative array of resilient contacts suitable for inclusion in the socket of FIG. 5.

Referring to FIG. 2, bypass capacitor 11 is connected directly to terminals 23A through capacitor terminals 11A. Resilient contacts 21 are long enough to provide significant clearance for capacitor 11. Referring to FIG. 3, the bypass capacitor 11 can lie within the boundaries of semiconductor device 12 but also can extend beyond those boundaries, depending on other design constraints such as the position of neighboring devices on the PC board 10. The capacitor could be in other positions as well, such as in a central region of the semiconductor device. FIG. 6 illustrates an array of connections, showing various components 52 near the periphery, components 53 within a field of contacts, and components 54 in the outer row of contacts of an electronic device 51 which may be an IC or a socket for an electronic device such as an IC.

In one preferred embodiment, a bypass capacitor is connected between two voltage levels, one higher than the other, typically Vdd and Vss. In certain applications, one skilled in the art may choose to insert such a bypass capacitor between other levels, particularly between Vref and ground (for example, in a RamBus RIMM module) or Vdd and ground. Other useful voltages include VddA, VssA, VddB, and VssB.

Figure 7A:
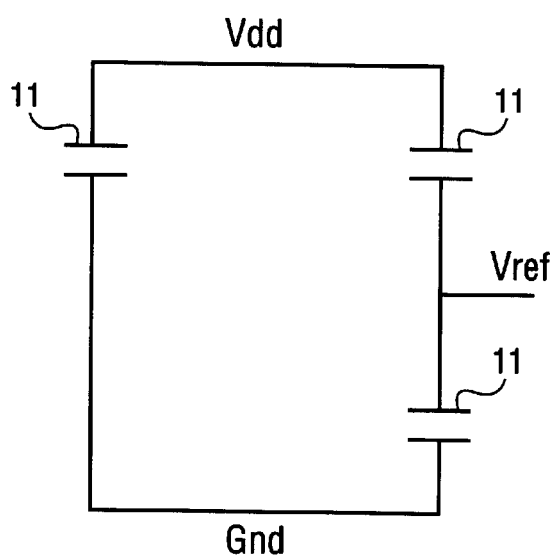
FIGS. 7A and 7B each illustrate a representative circuit showing potential ways to connect one or more capacitors in a circuit of this invention.
Figure 7B:
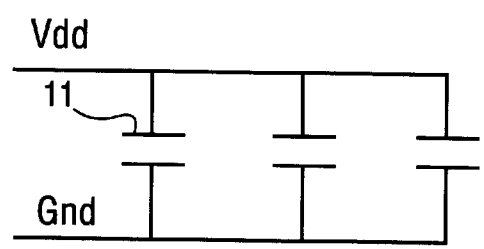

Multiple capacitors can be used in the same way. Referring to FIG. 7A, a capacitor 11 may be connected between Vdd and ground, another between Vdd and Vref, and yet another between Vref and ground. Another reason to use multiple capacitors might be to provide increased capacitance. Referring to FIG. 7B, three capacitors 11 are shown connected in parallel between Vdd and ground. The routing discussed below can be used in combination with the geometry of the electronic devices to choose appropriate electronic components such as a capacitor or resistor to connect to or near a semiconductor device, and in what location to place such an electronic component.

Figure 4A:
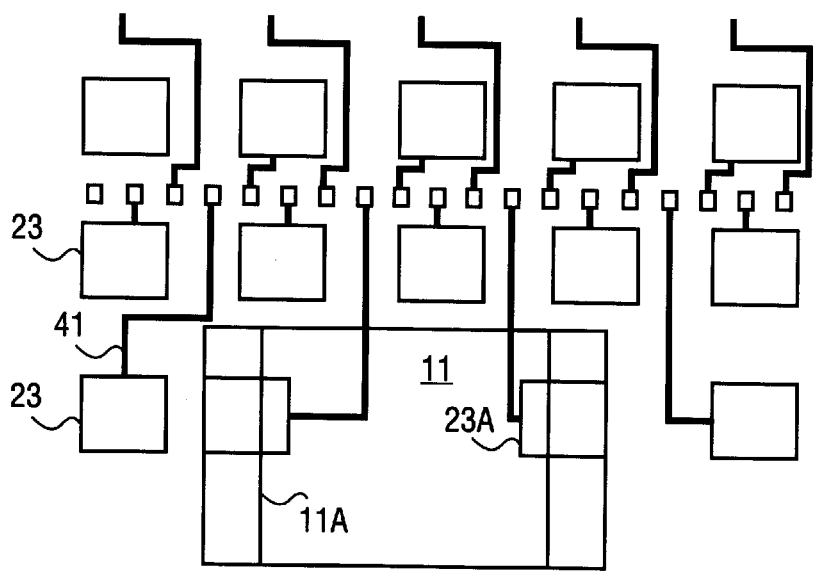
FIG. 4A illustrates a detailed top view of a portion of a representative semiconductor, showing routing of traces from a lead-on-center configuration to an area array.

Referring to FIG. 4A, it is common for semiconductor manufacturers to use a LOC (Lead On Center) pad configuration. With an illustrative configuration, the LOC pads are routed to terminal 23 via traces 41. A resilient contact can be bonded to each terminal 23. Similarly, selected LOC pads are routed to terminals 23A, where capacitor 11 is connected. This connection can be by soldering, conductive epoxy, or other means known in the art. Alternatively, a design could be selected where the selected power leads, e.g. Vss and Vdd, are routed to terminals 23 immediately adjacent terminals 23A and each terminal 23A can be connected directly to the corresponding terminal 23.

By way of example, in FIG. 4A if the pitch of the LOC pads is 4 mil pads on 8 mil centers, the corresponding dimensions of terminals 23 could be 16 mils square on 32 mil centers and the capacitor could be approximately 80×50 mils.

Figure 4B:
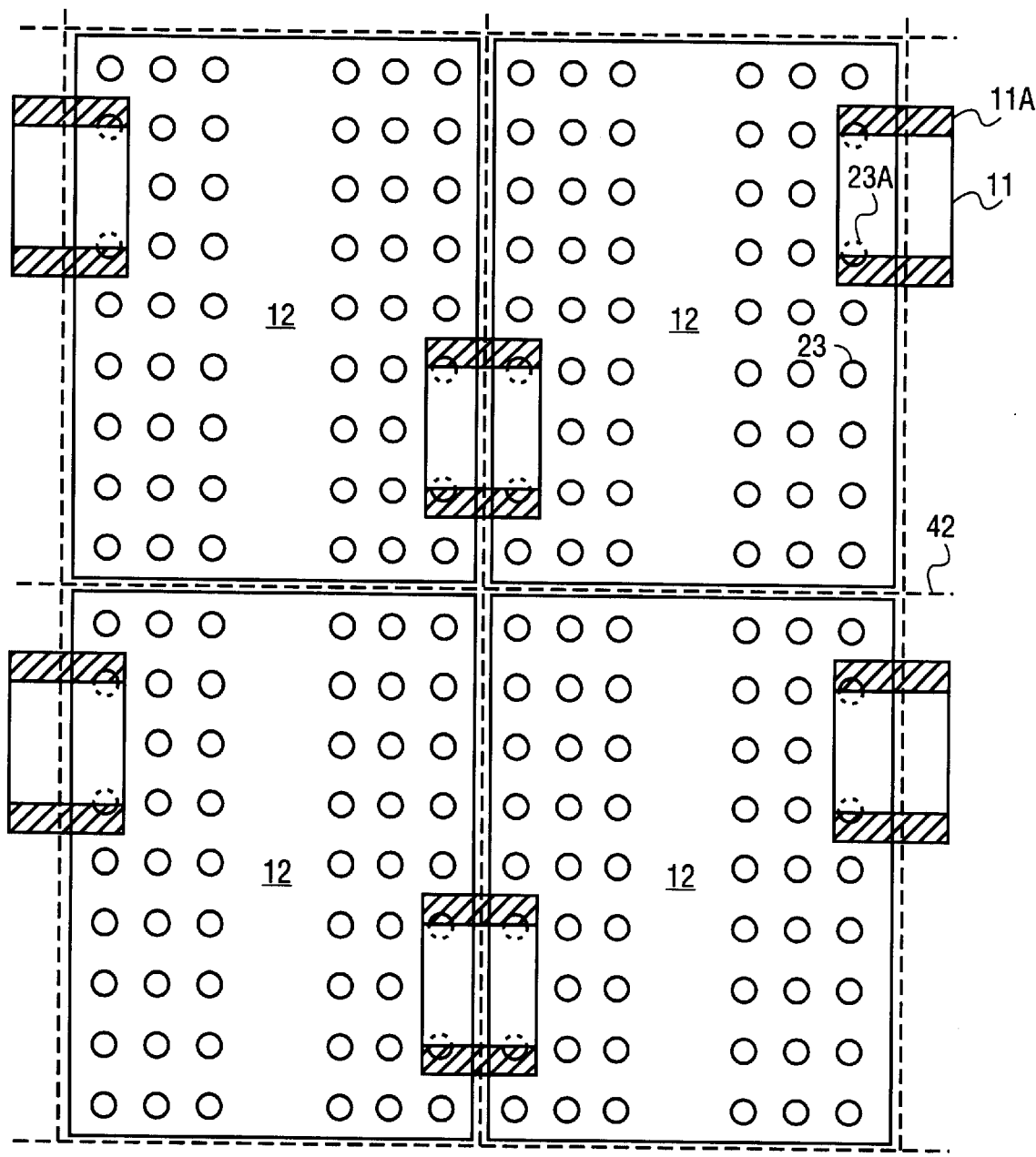
FIG. 4B illustrates multiple semiconductor devices and multiple capacitors.

Referring now to FIG. 4B, it may be desirable to incorporate multiple devices. Here, several semiconductor devices 12 are shown, each connected to two capacitors 11. Note that the housing structure of the capacitors may span multiple devices. This is particularly appropriate where the same signals are present on neighboring devices so the capacitor can be so positioned in an active array of devices. Such a structure also may be useful as a manufacturing intermediate structure. In this instance, the capacitors can be positioned and secured to an array of unsingulated devices, as shown. When the devices are subsequently separated by cutting with a wafer saw, for instance along scribe lanes 42, the saw can cut right through the capacitor housing structure, leaving a portion on each of the connected devices. In this embodiment, the circuits of neighboring devices need not be identical, since it is not intended that the devices be operated at the same time. Note also that the amount of relative capacitance need not be divided in half by this cutting method as a capacitor can be positioned more on one device than another to give proportionally more capacitance after the devices are singulated.

The contact elements between the semiconductor and the paired electronic device to which it is mated may take many forms. One preferred form is the composite resilient contact discussed above, with a soft core and a hard, resilient shell. Another preferred form is a resilient contact made in some other manner. A useful such contact is described in co-pending, commonly assigned U.S. patent application Ser. No. 08/852,152, entitled "Microelectronic Spring Contact Element", filed May 6, 1997, inventors Eldridge, Khandros, Mathieu and Pedersen. The corresponding PCT application was published Nov. 20, 1997 as WO 97/43654. The contact elements need not be resilient, either. For example, solder columns could be used for this connection. See, for example, FIG. 8 of the Parent application and associated discussion.

Using these teachings, it is easy to see how various components can be moved to different locations and achieve much the same function. For example, the resilient contact components can be built up on the PC board rather than on the semiconductor device. The capacitor could be connected to the PC board rather than on the semiconductor device. The resilient contacts and the capacitor can be connected to different members, such as contacts on a socket and a capacitor on the semiconductor device. As before, the connection can be by any appropriate means, such as solder or conductive epoxy. A mechanical connection with glue or other adhering or connection mechanisms may be used as well.

Figure 5:
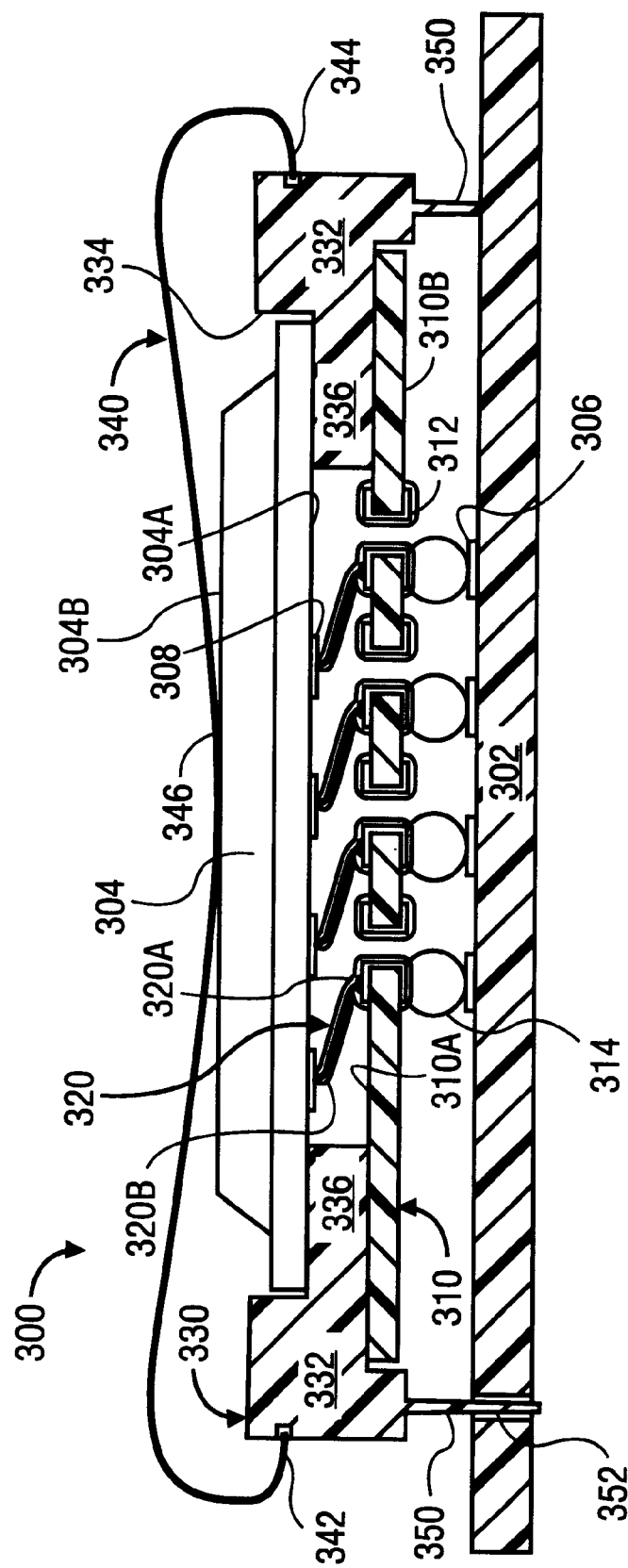
FIG. 5 illustrates a side, cross-section view of a socket structure incorporating a capacitor and resilient contacts for connecting a semiconductor device, copied from co-pending application Ser. No. 08/533,584.

The semiconductor device need not mate directly with a conventional PC board. It is particularly advantageous to provide a socketing mechanism where resilient contacts are bonded to an appropriate substrate, which is then mounted so a semiconductor can be securely positioned in contact with the resilient contacts. Such a socket is described in detail in a co-pending, commonly assigned patent application, filed Jun. 30, 1998, which is a divisional/continuation of U.S. patent application Ser. No. 08/533,584, which issued as U.S. Pat. No. 5,772,451. This U.S. Pat. No. 5,772,451 is incorporated herein by reference in its entirety. The corresponding PCT application was published May 23, 1996 as WO 96/15551. The socket can be secured to a PC board or other support by means of solder balls or other appropriate connection elements. FIG. 5 is taken directly from that application where it was FIG. 3.

Following the examples described above, referring to FIG. 6, the socket 51 can be modified so that a capacitor 52 is positioned on the periphery of an array or resilient contacts, connected to one or more contacts as appropriate. A capacitor 53 also can be positioned within the array of resilient contacts, replacing some number of contacts. Obviously it is important to design the semiconductor with some awareness of the desired packaging. If a traditional BGA semiconductor, with a regular, area array of contacts, is positioned in such a socket, it may be difficult to design a socket which does not include resilient contacts within the array. However, a capacitor 52 which is positioned near the edge of the array and appropriately connected could be used with an arbitrary design. Even here it is important to have some knowledge of the design of the semiconductor and corresponding socket as the pin assignments relate directly to which resilient contacts should be matched with a capacitor.

Assuming that the socket and semiconductor can be designed in conjunction, it becomes easier to select one or more power lead pairs that would benefit from inclusion of a small capacitor.

A socket housing can be designed as needed to accommodate the elements discussed above.

Resistors are commonly tied to signal lines for certain design considerations. Very commonly a line will be allowed to float at certain times. A line often will be tied to a resistor to keep it at or close to a selected logical state. It is quite common to use a pull-up resistor connecting the line to, for example, Vdd, selecting a resistor value such that the pull up current is relatively small compared to the current of a driver typical for this line. Thus when a driver is active, the state of the driver will primarily determine the logic level of the line, but when the driver is inactive, the line will tend to move to the pull-up logical value. Similar, a pull down resistor can tend to move the line to the other logical value. Such circuits are well known in the art.

Referring again to FIG. 6, the electronic components 52, 53, and 54 could equally well be resistors. With the routing techniques illustrated in FIG. 4, the position of a resistor can be varied significantly. Of course, resistors and capacitors can be combined in the same design.

Figure 8A:
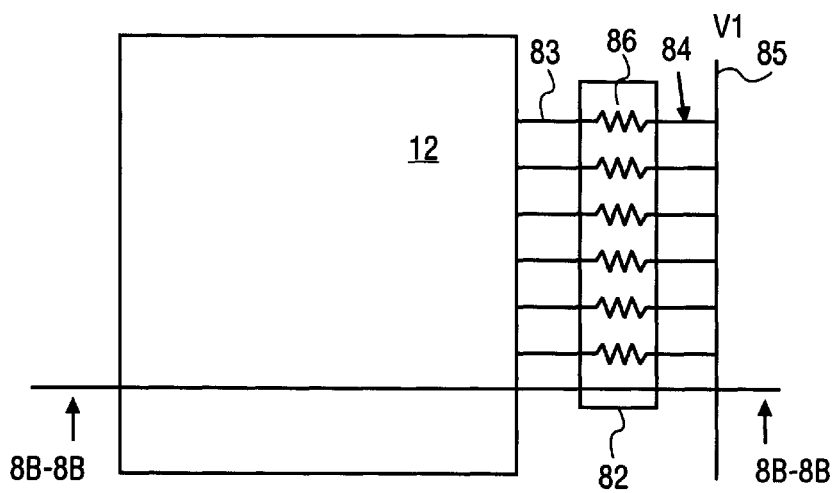
FIGS. 8A and 8B illustrate an ancillary device as a block of resistors formed on silicon, fitted close to and partially under the primary semiconductor device.

In one preferred embodiment, a bank of resistors are fabricated on a silicon device (e.g. an IC). A group of selected signals in a semiconductor device are routed to provide a connection point near a periphery of the semiconductor device. Referring now to FIG. 8A, one or more resistors 86 are fabricated into resistor block 82 using conventional techniques for making resistors on a semiconductor substrate such as silicon. Each resistor is connected via connection 83 to a circuit on semiconductor device 12, which may be an IC as described above, and further connected by connection 84 to voltage level V1 on line 85. In one representative preferred embodiment, V1 is Vdd and the resistors 86 function as pull-up resistors. In a second representative preferred embodiment, V1 is Vterm, for example in an implementation of a RamBus memory circuit. Such a voltage level is provided to terminate a RamBus channel in a defined way. Information on RamBus designs can be obtained at the RamBus website, www.rambus.com, and in a number of patents assigned to RamBus. Of course, various resistors can be connected to various voltage levels according to the needs of a given design and implementation.

The connections 83 and 84 are illustrated as lines in the drawing but can take the form of any functional connection known in the art. The connections could take the form of wire bonds, or could be packaging such as the springs 21 (not shown, but described, for example, in connection with FIG. 2) connecting device 12 and resistor block 82, which are in turn connected to some appropriate substrate such as PC board 10 and connected together through conventional traces on or in the substrate PC board 10. V1 (85) then could be provided using conventional PC board manufacturing techniques to connect to corresponding terminals of resistors 86.

A preferred embodiment can connect resistor block 82 in the space between semiconductor device 12 and a mating component such as PC board 10. In one preferred embodiment, the resistor block has a relatively small number of resistors and is secured in a manner similar to that described and shown in FIGS. 2, 4A, and 4B.

Figure 8B:
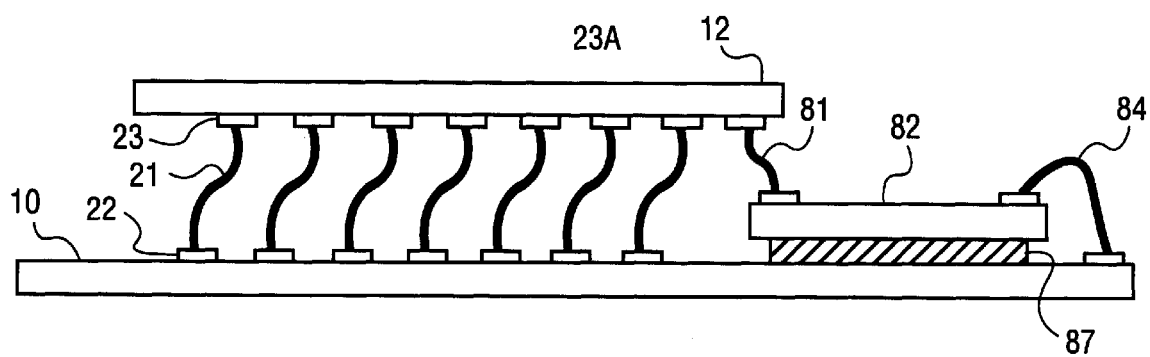

In yet another preferred embodiment, an ancillary electronic component such as resistor block 82 can be positioned near semiconductor device and connected using some of the techniques described above. Referring to FIG. 8B (a cross-sectional view of the assembly of FIG. 8A taken at line 8B—8B as shown in FIG. 8A), resistor block 82 is secured to PC board 10 in part by means of connecting material 87. This connecting material may be flexible, as in an elastomeric material such as silicone, or may be rigid, such as hard epoxy. Connection 84 is established by means of a wire bond, connected in a conventional manner to a pad on PC board 10 which is connected in turn to voltage V1 suitable for that resistor in the given circuit design.

Connection 83 may be made by at least two different methods. First, not shown, a C4 ball can be positioned on resistor block 82 so as to connect to semiconductor device 12. Second, a modified spring 81 can be fabricated to meet a contact pad on resistor block 82 as shown in FIG. 8B in a way analogous to the way springs 21 meet corresponding contact pads 22 on PC board 10. Some of the conditions and considerations for making a population of springs in varying heights are discussed in the Parent application Ser. No., 08/340,144.

A particularly useful ancillary electronic component is a semiconductor device that is best made with a process different than the process for making the primary semiconductor. One useful example of an ancillary device is a high precision clock chip. Such a high precision chip is typically manufactured under conditions that are not optimal for making a typical memory chip. By manufacturing each component under conditions optimized for making the respective devices, the devices can subsequently be closely integrated using the teachings of this invention. Referring to FIG. 8B and the related discussion, the ancillary device can conveniently be mounted in the manner shown, or in other ways as discussed throughout this disclosure. Another useful ancillary electronic component may be a cache memory IC, such as a high speed cache memory chip.

The teachings of the invention are useful with other contactor structures. For example, referring to FIGS. 9A and 9B, solder balls 91 are used to secure carrier 92 to primary substrate, PC board 10. The solder balls can be made in a variety of sizes, easily up to about 40 mils or larger, which can provide space to position an ancillary electronic component such as component 99. The balls can be of any suitable size, which may be only about 5 to 10 mils for a suitable small component. A representative small component could be a resistor block 82, which could be positioned in a manner similar to that shown in FIG. 5B. In one preferred embodiment, the ancillary electronic component is a capacitor secured under the carrier 92.

Figure 9A:
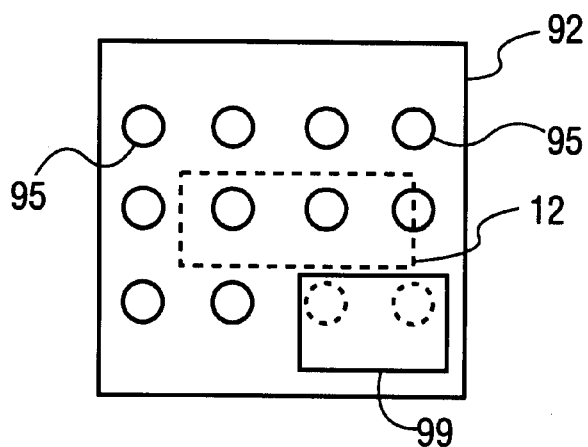
FIGS. 9A and 9B illustrate a structure using an alternative contact structure, namely C4 balls, and an alternative primary device, here a carrier which in turn supports an active device.
Figure 9B:
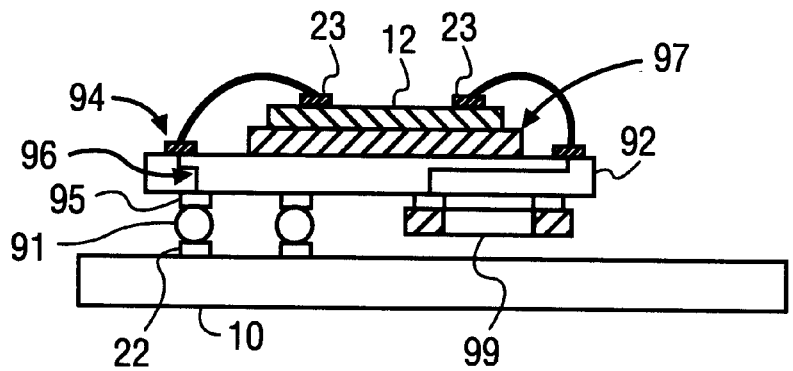

FIGS. 9A and 9B illustrate a second useful variation on the present invention. The semiconductor device may be mounted on an intermediate carrier device. In this illustrative figure, semiconductor device 12 is mounted by connecting material 97 to carrier 92. A terminal 23 on semiconductor device may be wire bonded to a corresponding terminal 94 on the carrier. Terminal 94 may in turn be connected such as by routing material 96 to corresponding terminal 95 on the opposing primary surface of carrier 92. Finally, connection means such as solder ball 91 connects terminal 95 to a corresponding terminal 22 on PC board 10.

Connecting material 97 may suitably be an elastomeric material such as silicone rubber. Carrier 92 may suitably be a multilayer ceramic substrate, with terminals on opposing faces connected by interconnecting circuitry or routing material 96. A detailed discussion of useful carriers and connection methods may be found in co-pending, commonly assigned patent application Ser. No. 08/602,179, filed Feb. 15, 1996, entitled "Methods of Mounting Spring Contacts to Semiconductor Devices," also published as WO 97/16866 on May 9, 1997.

Figure 10:
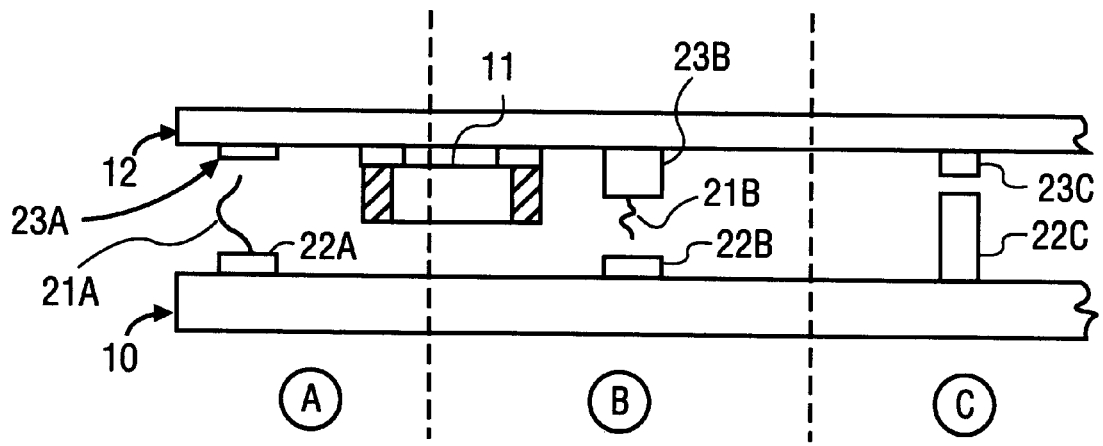
FIG. 10 is a representative drawing of alternative connection mechanisms, in cross section, showing three classes of connectors, each in a region A, B, and C.

Note also that connections between a semiconductor device may take many forms and be useful within the present invention. It is desirable to use a resilient connector for a variety of reasons, but a generally non-resilient connection as formed using solder balls as illustrated in FIG. 9B can be useful as well. Referring to FIG. 10, which is chosen to illustrate a variety of connections, in Region A the connection may be secured first to the mating component rather than the semiconductor, as resilient contact 21A is secured to terminal 22A, then brought into contact with terminal 23A on the semiconductor 12. Next, the terminals may be raised by some amount from the surface of the corresponding electronic component. In region B of FIG. 10, terminal 23B is considerably larger than corresponding terminal 23A, thus taking up some space between the semiconductor and the mating component. Similarly, terminal 22B is enlarged relative to corresponding terminal 22A. Resilient contact 21B is sized accordingly. Of course the specific height of each terminal can be selected according to the component 11 to be secured. Taken to the extreme, it may be useful to provide terminals in the form of posts. Referring to region C of FIG. 10, terminal 23C is a post of some height. Similarly, terminal 22C is a post of some height, selected to mate with post 23C to provide the desired spacing. Specific dimensions can be selected by one skilled in the art to meet selected design criteria.

Another aspect of the present invention relates to the use of an ancillary electronic component, such as capacitor 11, as a travel stop structure which defines a minimum separation distance between a primary component, such as an IC 12, and a mating component, such as a PC board 10. Before describing various details concerning this aspect, certain background material will be described.

There are numerous interconnect assemblies and methods for making and using these assemblies in the prior art. For example, it is usually desirable to test the plurality of dies on a semiconductor wafer to determine which dies are good prior to packaging them and preferably prior to their being singulated from the wafer. To this end, a wafer tester or prober may be advantageously employed to make a plurality of discrete pressure connections to a like plurality of discrete contact elements (e.g. bonding pads) on the dies. In this manner, the semiconductor dies can be tested prior to singulating the dies from the wafer. The testing is designed to determine whether the dies are non-functional ("bad").

Figure 11:
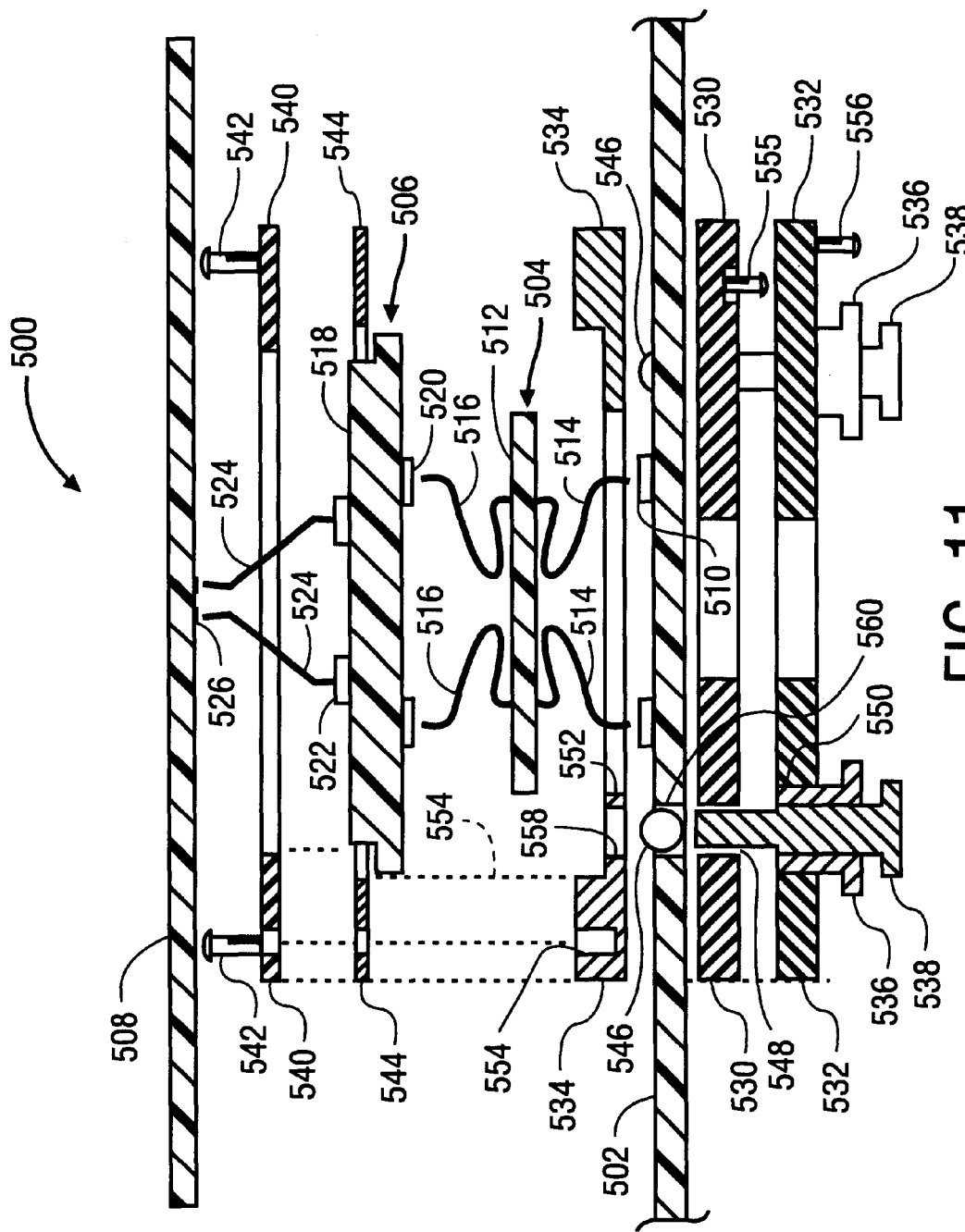
FIG. 11 shows an example of a probe card assembly in the prior art.

A conventional component of a wafer tester or prober is a probe card to which a plurality of probe elements are connected. The tips of the probe elements or contact elements effect the pressure connections to the respective bonding pads of the semiconductor dies. FIG. 11 shows an interconnect assembly 500 which is an example of a probe card in the prior art. The probe pins or contact elements 524 make connections to bonding pads 526 on the semiconductor wafer 508. The probe card assembly includes several components which are assembled together, including the probe card 502, the interposer 504, and the space transformer 506. The probe card 502 is typically a printed circuit board which includes circuit traces to various electrical components which are used in performing the electrical tests of the semiconductor die being probed. Contact elements 510 on the probe card 502 make contact with the bonding pads 526 through a series of intervening layers which include the interposer 504 and the space transformer 506 as shown in FIG. 11. The interposer 504 provides for a resilient, springlike positioning in the vertical or z direction in order to provide adequate contact for all contact elements at the bonding pads regardless of the length of the contact elements used on the intervening layers, such as the contact elements 524 which resemble springs. The space transformer 506 performs a pitch reduction and is also the substrate on which resilient contact elements are disposed. Further details concerning the probe card assembly 500 shown in FIG. 11 may be found in PCT International Publication No. WO 96/38858. A particular interposer will now be discussed for further background.

Figure 12A:
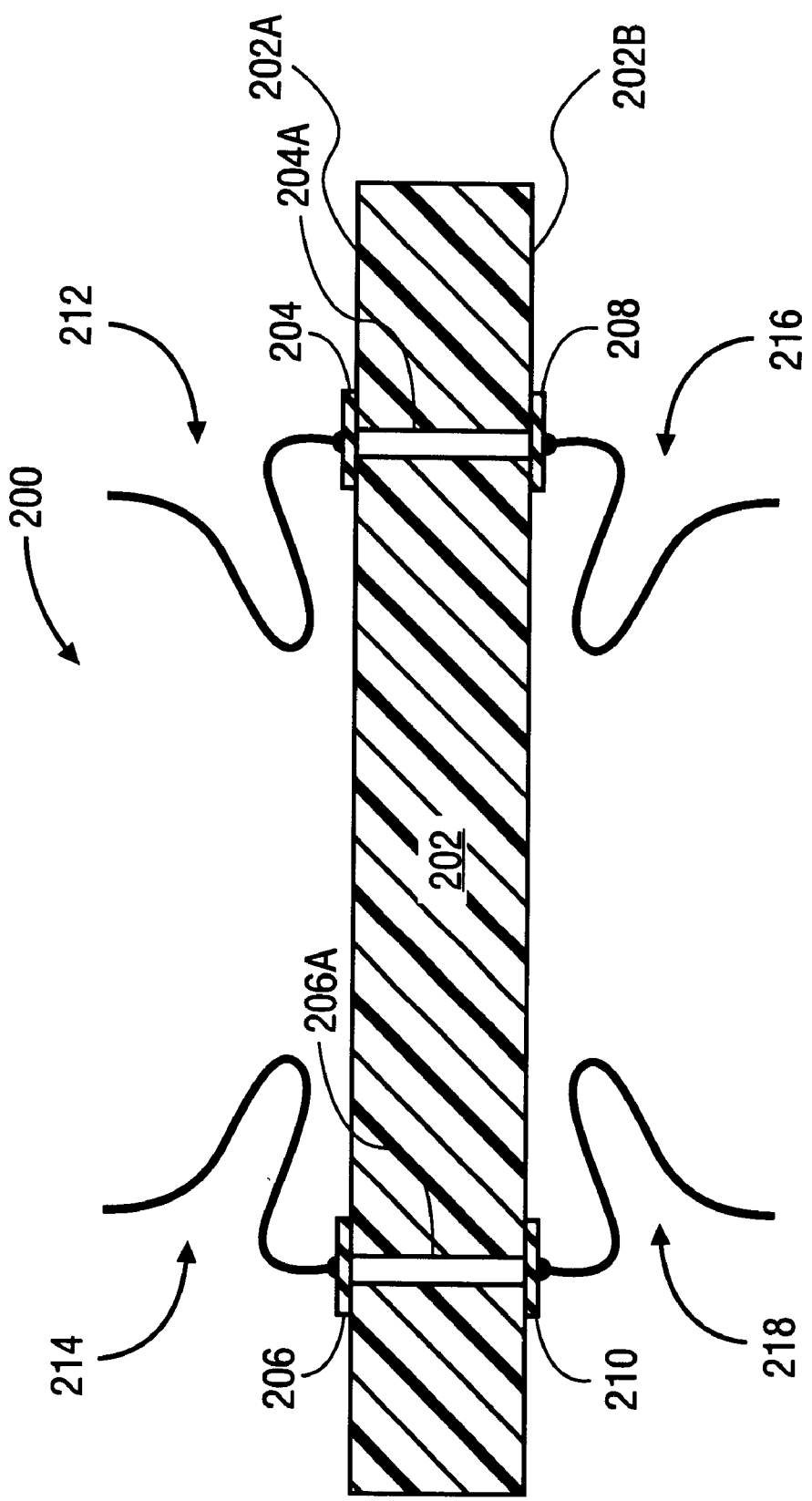
FIG. 12A shows an example of an interposer which is an element of a probe card assembly of the prior art.
Figure 12B:
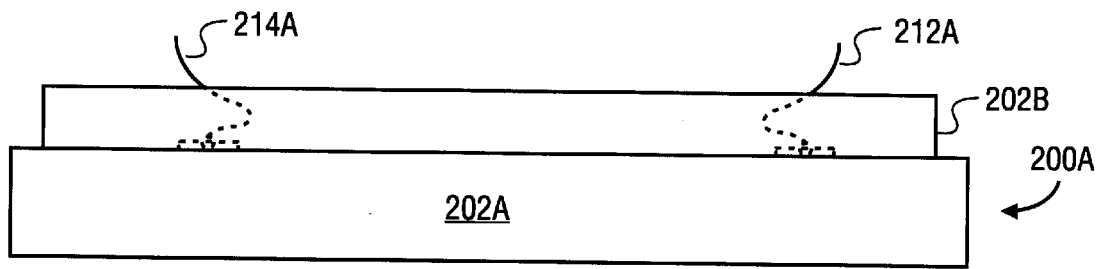
FIG. 12B shows an cross-sectional view of another example of an interposer which may be used in probe card assemblies of the prior art.
Figure 12C:
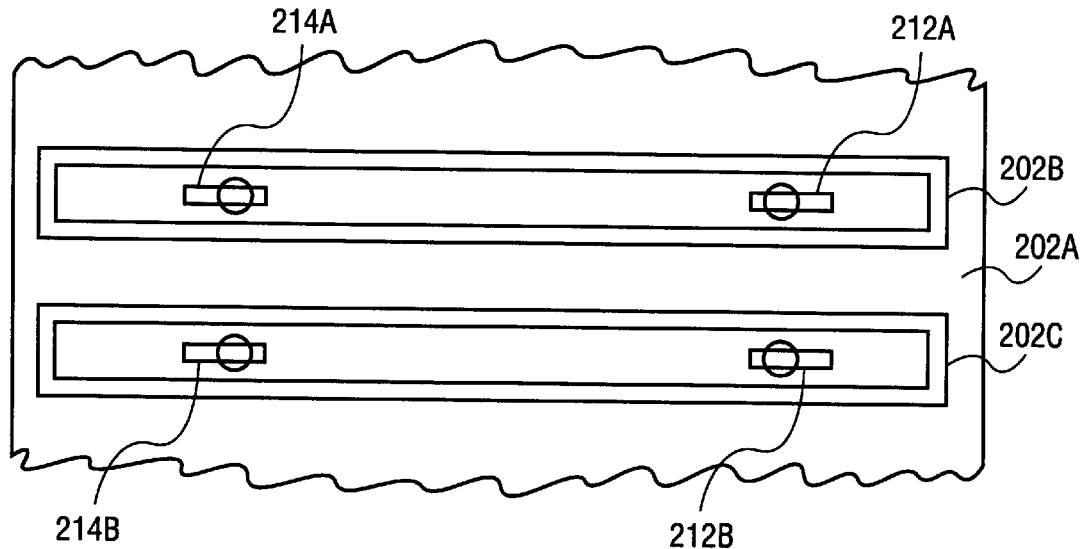
FIG. 12C shows a top view of the interposer shown in FIG. 12B.

FIG. 12A shows in more detail an interposer assembly 200 having a substrate 202 on which resilient contact elements are attached, including contact elements 212, 214, 216, and 218. Contact elements 212 and 216 are electrically coupled from one side of interposer 200 to the other side by a through connect 204A, and contact elements 214 and 218 are electrically coupled by a through connect 206A. Examples of these resilient contact elements include any of a number of different spring type elements, including those described in the PCT International Publication No. WO 96/38858. When the interposer is used in an assembly such as the assembly 500 of FIG. 11, the resilient contact elements are flexed to a compressed state in which their vertical heights are reduced. This flexed state results in a force which drives the contact elements into their corresponding connection points, such as the bonding pads 526. FIGS. 12B and 12C show an alternative interposer structure of the prior art. The interposer 200A includes a substrate 202A. Two resilient contact elements 212A and 214A are attached to one surface of the substrate 202A. The resilient contact elements of the bottom portion of the substrate 202A are not shown in this figure. The resilient contact elements on the upper surface of the substrate 202A are protected by a channel structure 202B which surrounds the resilient contact elements 212A and 214A. This can be seen from the top view of the interposer 200 which is shown in FIG. 12C. The channel 202B protects the resilient contact elements within the channel but is not designed to contact another substrate, and the channel 202C protects resilient contact elements 214B but is not designed to contact another substrate.

Figure 13A:
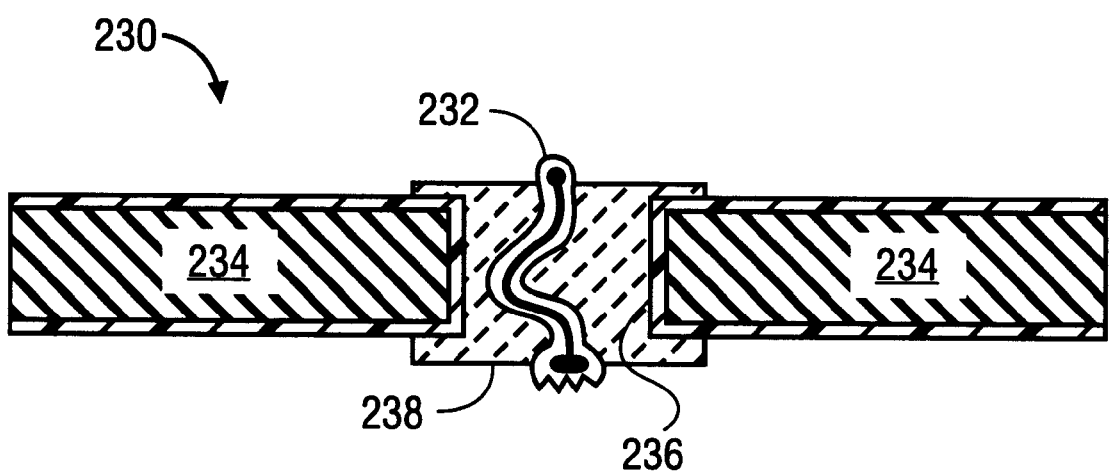
FIG. 13A shows a cross-sectional view of another example of an interposer of the prior art.
Figure 13B:
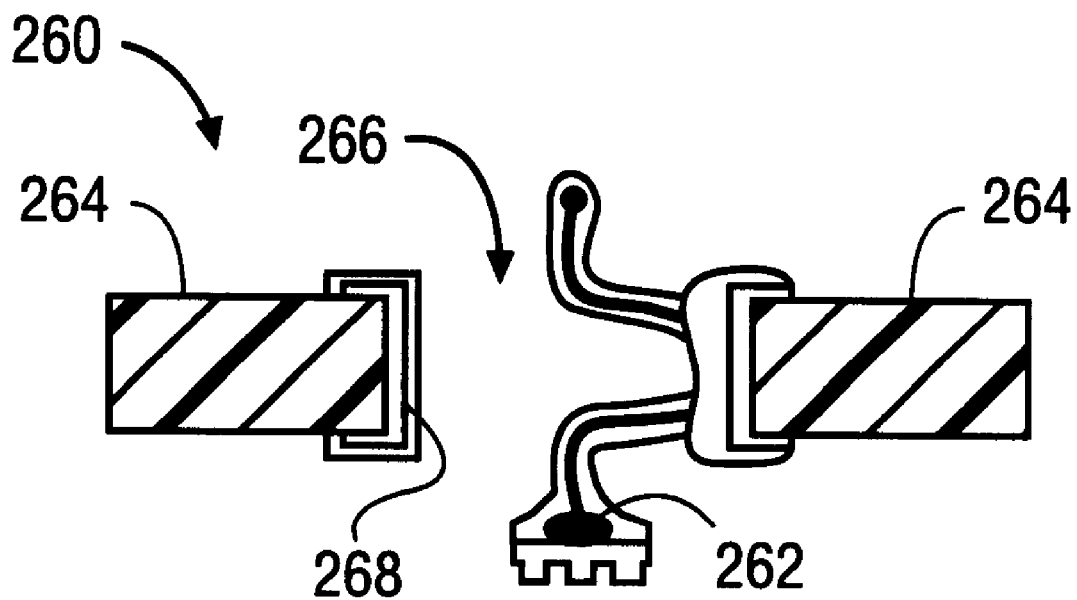
FIG. 13B shows a cross-sectional view of another interposer structure of the prior art.

FIG. 13A shows another example of an interposer of the prior art. The substrate 234 is placed over the interconnection elements 232 so that the interconnection elements 232 extend through the holes 236. The interconnection elements 222 are loosely held within the substrate by a suitable material 238, such as an elastomer which fills the holes 236 and which extends from the top and the bottom surfaces of the support substrate. FIG. 13B illustrates another interposer structure of the prior art in which the interconnection element within the hole 236 is attached to (e.g. by soldering) the middle portions of the holes 266 in the substrate 264.

Figure 14:
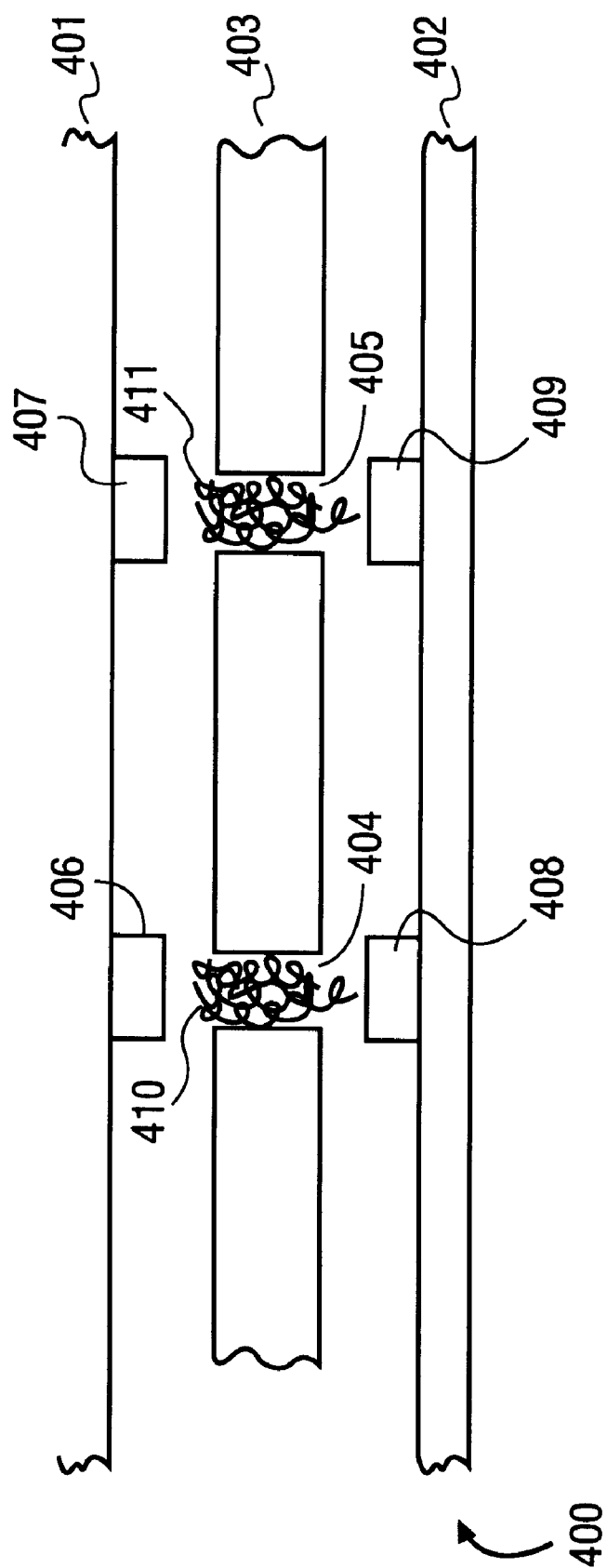
FIG. 14 shows an example of an interconnect assembly of the prior art.

FIG. 14 illustrates another interconnect assembly of the prior art. This interconnect assembly is sometimes referred to as a cinch connector 400. As shown in FIG. 14, two contact elements 406 and 407 are disposed on a substrate 401 in order to make contact with two other contact elements 408 and 409 which are disposed on another substrate 402. The intermediate layer 403 includes holes 404 and 405. The hole 404 is positioned between the contact elements 407 and 408, and the hole 405 is positioned between the contact elements 407 and 409. Each hole includes a resilient material which is used to make contact between its respective contact elements as shown in FIG. 14. When the substrates 401 and 402 are pressed together, the contact elements or pads 406 and 408 move toward each other as do the contact elements 407 and 409. The movement is stopped when each element comes into mechanical contact with the intermediate layer 403, and electrical contact is established by the respective conductive material (e.g. resilient material) which is disposed between the two contact elements.

As can be seen from the foregoing discussion, the use of resilient contact elements to make contacts to bonding pads or to other contact elements allows for tolerance in the vertical or z direction such that most if not all contact elements will be able to make contact even if their lengths vary slightly. However, this tolerance sometimes leads to the destruction of resilient contact elements as they are compressed too much in the vertical direction. While the assemblies shown in FIGS. 12B and 12C and in FIG. 13A may tend to protect resilient contact elements, they do not and are not intended to define a position in which all contact elements should have made contact vertically. The cinch connector of FIG. 14 does tend to protect the resilient contact elements by preventing the substrates 401 and 402 from coming too close together. However, this assembly is relatively complicated due to the requirement of having, in a separate layer, a plurality of holes each of which includes and supports a conductive material such as a spring.

Thus it is desirable to provide an improved interconnect assembly which may take advantage of the features of a resilient contact element without having too much tolerance in the z direction which could result in the overflexing or destruction of the resilient contact elements. This is particularly important for interconnection over large mating areas (as in semiconductor wafers), where tolerance issues make controlled deflection of interconnect elements difficult.

The present invention provides a plurality of interconnect assemblies and methods for making and using these assemblies. In one example of the present invention, an interconnect assembly includes a substrate and a resilient contact element having at least a portion thereof which is capable of moving to a first position. The resilient contact element is disposed on the substrate. A stop structure, also disposed on the substrate, defines the first position in which the resilient contact element is in mechanical and electrical contact with another contact element. The stop structure includes a circuit component, although it is not necessary that a circuit be included.

Typically in this example, the another contact element is disposed on a second substrate, and the stop structure defines a minimum separation between the substrate and the second substrate when the resilient contact element is in mechanical and electrical contact with the another contact element.

According to another example of the present invention, an interconnect assembly includes a first substrate and a first contact element which is disposed on the first substrate. A stop structure defines a first position of a first resilient contact element which is disposed on a second substrate when the resilient contact element is in mechanical and electrical contact with the first contact element. Typically, the resilient contact element has at least a portion thereof which is capable of moving to a first position when the resilient contact element is compressed.

Figure 15A:
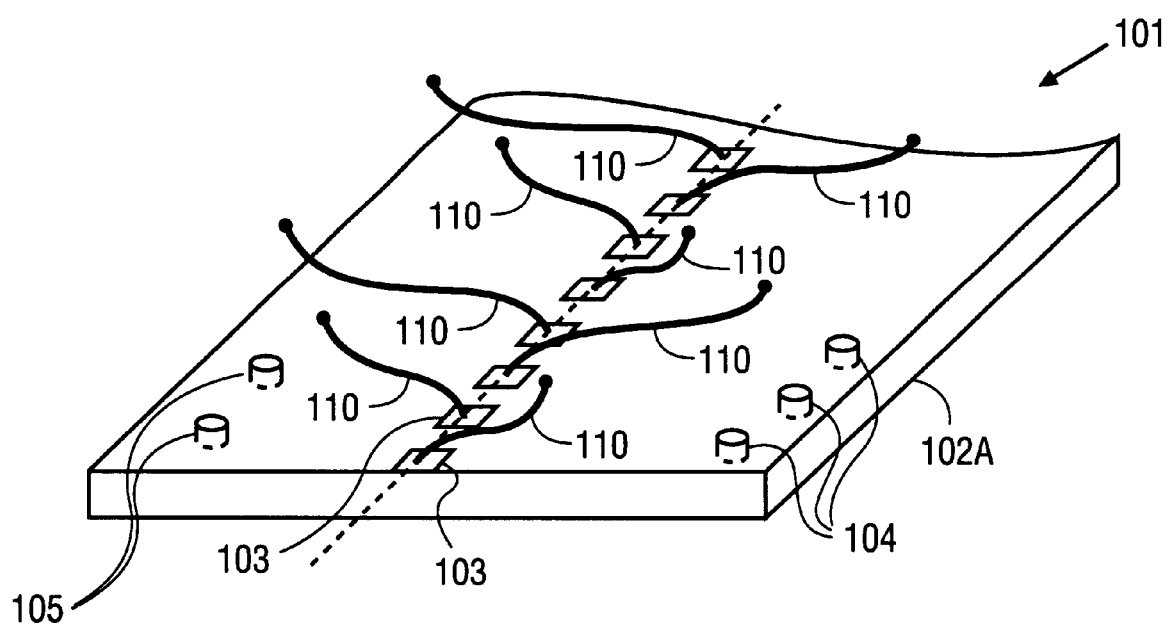
FIG. 15A shows a perspective view according to the invention in which resilient contact elements are disposed on a substrate along with stop structures on the substrate.

FIG. 15A shows a perspective view of eight resilient contact elements 110, each of which are disposed on a substrate 102A. The interconnect assembly shown in FIG. 15A may be formed by any number of methods; for example, the resilient contact elements may be mechanically secured to pads 103 by a wire bonding operation. Alternatively, the resilient contact elements may be lithographically formed. Also disposed on the substrate 102A are a plurality of stop structures. The left row of stop structures 105 protrudes above the top surface of the substrate 102A by a predetermined amount which will typically be the same amount by which the right row of stop structures 104 protrudes above this top surface. These stop structures are designed to determine/limit the maximum amount of compression or flexing which can occur with the resilient contact elements. Each resilient contact element includes at least a portion thereof which is capable of moving to a first position when the resilient contact element is compressed in a vertical direction towards the top surface of the substrate 102A. Each stop structure is sized vertically such that it defines a first position when the resilient contact elements are in mechanical and electrical contact with other contact elements. Each stop structure is designed, in one embodiment, so that its vertical height above the substrate is less than the vertical height of the shortest resilient contact element which statistically is reasonably likely to exist (e.g. the stop's height is less than 99.9% of the heights of possible resilient contact elements).

FIG. 15B shows a perspective view of another embodiment of the invention in which an in-line row of bonding pads 103 are coupled by fan-out traces 103A to several resilient contact elements 110A. The fan-out traces 103A allow a spatial distribution of the resilient contact elements from the in-line row without requiring the use of resilient contact elements having different lengths (as in the case of FIG. 15A where the resilient contact elements 110 have different lengths in order to make contact to spatial dispersed elements). Each of the bonding pads 103 is coupled electrically to a corresponding fan-out trace 103A which is electrically coupled to a corresponding pad 103B, and each resilient contact element 110A is electrically and mechanically coupled to a corresponding pad 103B. Several stop structures 105 are disposed on the surface of the integrated circuit 102B.

Figure 16A:
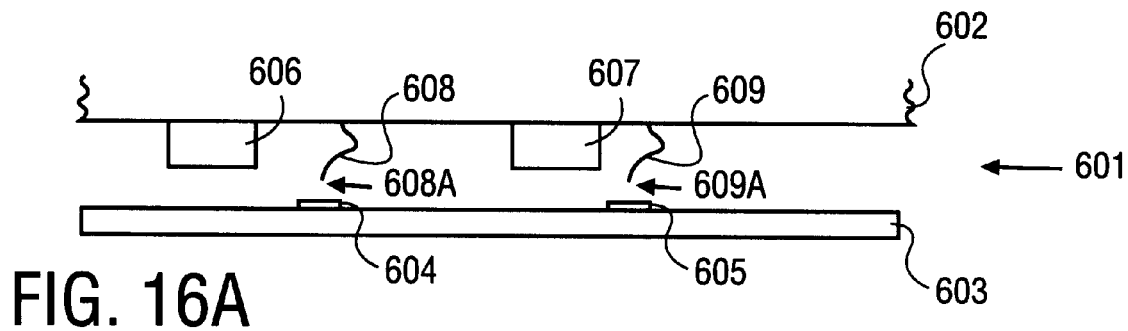
FIG. 16A shows an example of one embodiment of the present invention (before mechanical and electrical contact is made).
Figure 16B:
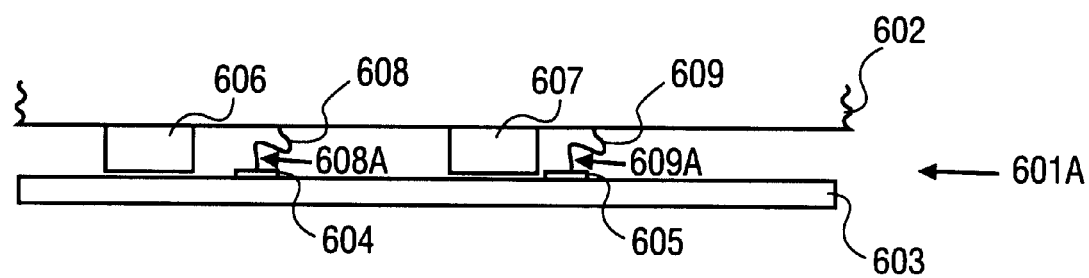
FIG. 16B shows the interconnect assembly of FIG. 16A when mechanical and electrical contact has been made.

FIG. 16A shows an example of an interconnect assembly 601 of the present invention. The interconnect assembly 601 includes a substrate 602 and a substrate 603. The substrate 603 includes two contact elements 604 and 605 which are attached to the substrate 603 and thereby disposed on the substrate 603. The substrate 602 includes two stop structures 606 and 607 which may be disposed in relative proximity to the resilient contact elements 608 and 609. These resilient contact elements may be the spring interconnect elements described in the PCT International Publication No. WO 96/38858. Each resilient contact element includes a tip or farthest extent which typically extends beyond the top of the respective stop structure as shown in FIG. 16A. For example, the tip 608A of the resilient contact element 608 extends beyond the top of the stop structure 606 such that the total vertical length of the resilient contact member 608 exceeds the total vertical length of the stop structure 606. The height of the stop structure is predetermined in order to define a first position when the resilient contact element is in mechanical and electrical contact with another contact element. Further, the stop structure's height defines a separation between one substrate 602 and the other substrate 603 when the resilient contact element is in mechanical and electrical contact with another contact element, such as the contact elements 604 and 605. This is further shown in FIG. 16B in which the substrates 602 and 603 have been forced together to create the interconnect assembly 601A. As can be seen from FIG. 16B, the stop structures 606 and 607 are in mechanical contact with the substrate 603; in particular, the top surface of each stop structure is mechanically abutting the top surface of the substrate 603. This defines the first position of the tip 608A and the tip 609A of the resilient contact elements 608 and 609 respectively as they make contact with the contact elements 604 and 605 respectively.

It will be appreciated that the interconnect assembly 601 may be used in a number of different contexts. For example, the substrate 602 may be part of a probe card assembly which is coupled to a wafer prober or wafer tester and the substrate 603 may be a semiconductor integrated circuit or a plurality of integrated circuits on a semiconductor wafer. Alternatively, substrate 602 may be part of a semiconductor integrated circuit or a plurality of integrated circuits on a semiconductor wafer. In this case, the resilient contact elements will typically be coupled to bonding pads or other contact elements on the integrated circuit, and the stop structures will be attached to the top surface of the integrated circuit. The substrate 603 may be part of a probe card structure which is designed to make electrical contact with the various resilient contact elements in order to test or burn-in the integrated circuit or a plurality of integrated circuits on a semiconductor wafer. Alternatively, the substrate 603 may be part of a package assembly which is used to make permanent contact through the resilient contact elements, such as the elements 608 and 609 shown in FIG. 16A.

Figure 16C:
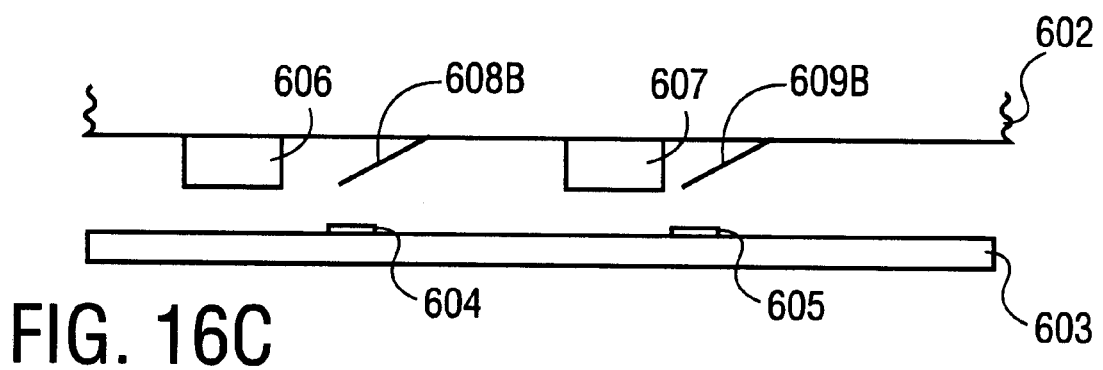
FIG. 16C shows an example of another embodiment of the present invention (before mechanical and electrical contact is made).
Figure 16D:
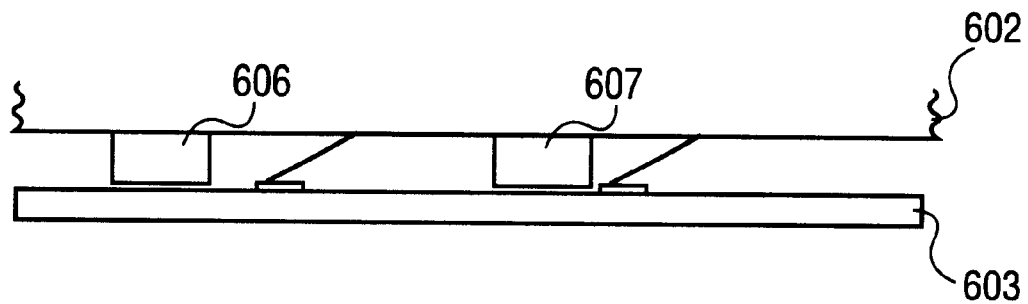
FIG. 16D shows the interconnect assembly of FIG. 16C when electrical and mechanical contact has been made.

FIGS. 16C and 16D show another example of the present invention which uses straight (cantilever-style) resilient contact elements 608B and 609B. These straight resilient contact elements are secured to the substrate 602 and bend to a compressed state as shown in FIG. 16D when the substrate 602 is pressed towards the substrate 603. The stop structures 606 and 607 determine the separation between the two substrates and determine the amount of compression of each resilient contact element when it is brought into mechanical and electrical contact with its corresponding pad.

Figure 17:
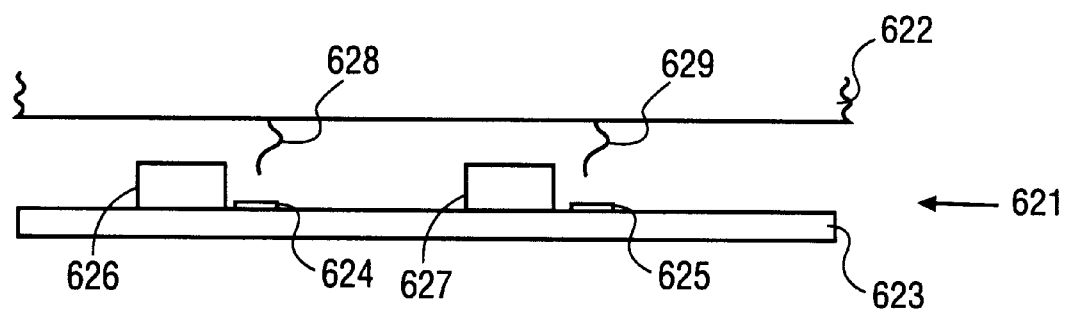
FIG. 17 shows another example of an interconnect assembly according to the present invention.

FIG. 17 shows an example of another interconnect assembly according to the present invention. The interconnect assembly 621 of FIG. 17 includes a substrate 622 and a substrate 623. Two resilient contact elements 628 and 629 are attached to a surface of the substrate 622 in order to make contact with the contact elements 624 and 625 respectively of the substrate 623. Two stop structures 626 and 627 are also attached to the substrate 623 and are positioned relatively proximately adjacent to the corresponding contact elements 624 and 625. When the substrate 622 and 623 are forced together, the resilient contact elements 628 and 629 will flex to a position determined by the height of the stop structures. In one particular embodiment, the height of the stop structure may be from approximately 5 to 40 mils and the height of a resilient contact element before being compressed may be approximately 45 mils. The particular height of the stop structure relative to the height of the resilient contact element before compression will depend in part on the ability to control the planarity of the tips of the various resilient contact elements before compression. If this planarity can be controlled to great precision, then the height of the stop structure may be only slightly less than the height of a resilient contact element before compression. On the other hand, smaller stop structures provide a larger tolerance for error in forming an array of resilient contact elements to a particular height. The height of a stop structure is typically less than 150 mils and preferably less than 40 mils.

It will be appreciated that the present invention may be used with a large or small number of resilient contact elements and a number of stop structures disposed on the same or a different substrate. The invention may be used with a single (singulated) IC with a stop structure and a resilient contact element or with IC's on a semiconductor wafer where each such IC includes at least one stop structure and a resilient contact element. Each resilient contact element may have a corresponding stop structure (e.g. a post-like stop structure as in FIG. 15B) or one stop structure may be shared by several resilient contact elements. Furthermore, it will be appreciated that the contact elements and the resilient contact elements are coupled to various circuit elements, whether these circuit elements are disposed on the integrated circuit being tested or in a probe card circuit or in a circuit used in a finally assembled system which includes the packaged integrated circuit.

Figure 18A:
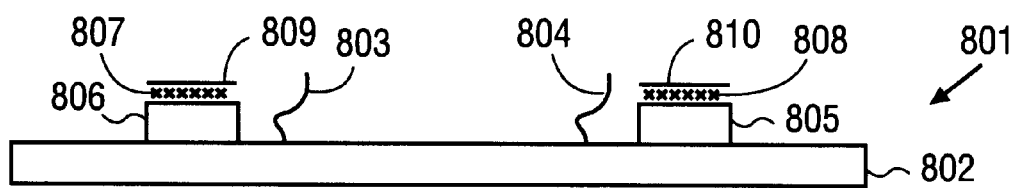
FIG. 18A shows an example of another embodiment of an interconnect assembly according to the present invention.

FIG. 18A illustrates another example of an interconnect assembly according to the present invention. The interconnect assembly 801 includes a substrate 802 which is attached to two stop structures 805 and 806. Also attached to the substrate 802 are two resilient contact elements 803 and 804. It will be appreciated that the substrate 802 may be part of an integrated circuit or may be part of a probe card assembly or other testing or burn-in apparatus. Each stop structure as shown in FIG. 18A includes an adhesive layer and a covering disposed over the adhesive layer. Stop structure 806 includes an adhesive layer 807 disposed on the top surface of the stop structure, and a covering 809 is disposed over the adhesive 807. This covering may be layer such as a foil or a plastic which may be peeled away or otherwise removed from the adhesive. Similarly, the stop structure 805 includes an adhesive layer 808 and a covering layer 810. The coverings may be peeled away in order to expose the adhesive and then the adhesive may be used to attach the stop structure as well as the rest of the assembly 801 onto another object, such as another substrate. For example, the substrate 802 may be attached to an integrated circuit (not shown) such that the bonding pads of the integrated circuit mate with the resilient contact elements in order to make mechanical and electrical contact with those elements. The substrate 802 may adhere to the top surface of the integrated circuit by removing the coverings on the top of the stop structures and by pressing the substrate 802 down towards the integrated circuit such that the adhesive on the stop structures is brought into contact with the top surface of the integrated circuit. Thus, the adhesive layers on the tops of the stop structures bond substrate 802 to the integrated circuit and cause the resilient contact elements to be secured into mechanical and electrical contact with the corresponding bonding pads or other contact elements on the integrated circuit. In this manner, a package for the integrated circuit may be formed between the substrate 802 and its corresponding structures and the integrated circuit. It will be appreciated that in this example, the substrate 802 will include interconnections from the various resilient contact elements towards other contact points to allow interconnection to other electrical components outside of the packaged assembly formed by the substrate 802 and the integrated circuit which is attached to the substrate.

Another use of the interconnect assembly 801 of FIG. 18A may involve the case where the substrate 802 is itself an integrated circuit, and the resilient contact elements 803 and 804, as well as other contact elements necessary to make connections, are attached to the various bonding pads or other contact elements on the integrated circuit. The stop structures may be attached to the top surface of the integrated circuit as shown in FIG. 18A. After the coverings above the adhesive layers are removed, the integrated circuit may be pressed against another wiring substrate in order to make electrical contact between the circuitry in the integrated circuit in the substrate 802 in this example and various outside electrical components through the another substrate. This another substrate may be part of a probe card assembly or a burn-in assembly or may be part of a final integrated circuit package which includes interconnections to the "outside" environment.

Figure 18B:
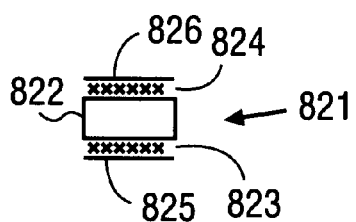
FIG. 18B shows another example of a stop structure according to the present invention.

FIG. 18B shows an alternative embodiment of a stop structure 821 in which adhesive layers are applied to the top and bottom layers of the stop structure 822. This stop structure may include an electrical component which is prefabricated and then attached to the substrate. The adhesive layer 824 is formed on the top surface of the stop structure 822, and a covering 826 which is removable is placed on this adhesive. Another adhesive layer 823 is formed on the bottom surface of the stop structure 822 and is covered by the covering 825. This stop structure may be formed in a sheet or film and applied to a substrate in order to form a plurality of stop structures on a substrate.

Figure 19:
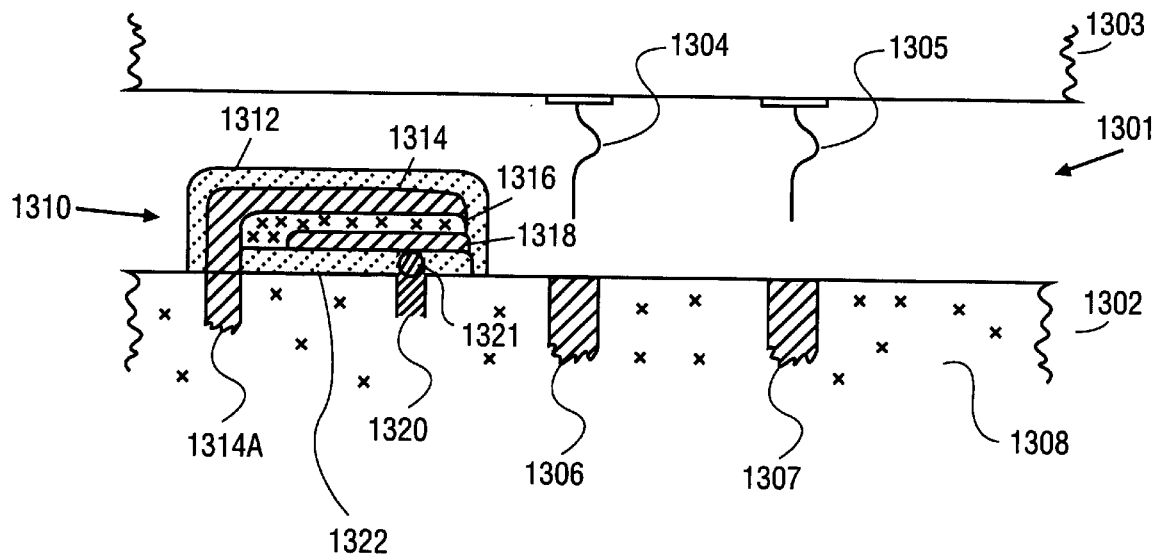
FIG. 19 shows an example of a stop structure having a circuit element according to one embodiment of the present invention.

FIG. 19 shows an example of an interconnect assembly 1301 which includes a stop structure 1310 that houses a circuit element, in this case a capacitor, which is coupled to circuitry in the integrated circuit of the substrate 1302. The stop structure 1310 is designed to define the minimum vertical separation between the substrate 1302 and the substrate 1303 when the resilient contact elements 1304 and 1305 are brought into mechanical and electrical contact with their corresponding contact elements 1306 and 1307 in the substrate 1302. The contact elements 1307 and 1306 are contained within an insulating material 1308 which may be a conventional dielectric material used in fabricating integrated circuits. It will be appreciated that the interconnection to various other circuit elements within the integrated circuit in the substrate 1302 is not shown in FIG. 19, which is a cross-sectional view through the stop structure 1310 and the substrate 1302. The stop structure 1310 is a multilayer structure including several dielectric layers and several conductive layers which may be metal layers. In the example shown in FIG. 19, metal (or other conductive) layers 1314 and 1318 are separated by an insulating layer 1316 to form a capacitor. The metal layers 1314 and 1318 as well as the insulating layers 1316 and 1322 are encapsulated within an insulating layer 1312. The stop structure 1310 itself may resemble a post or cylinder or other shapes (e.g. rectangular, arbitrary pattern, zig-zag of connected rectangle, etc.) along the surface of the substrate structure which is completely covered by the encapsulating insulating layer 1312. This insulating layer may be a polyimide material or silicon dioxide or other insulator. The metal layer 1318 is coupled electrically in one embodiment by a solder ball 1321 to a post or other contact element 1320 in the substrate 1302. The metal layer 1314 is coupled by a post structure 1314A which extends into the substrate 1302. In this manner, the capacitor in the stop structure 1310 is coupled electrically to a circuit element in the substrate 1302. It will be appreciated that there will be a number of well known techniques which may be employed in fabricating the stop structure 1310 to include an electrical element, such as the capacitor. In one example, the post structures 1314A and 1320 may be formed in the substrate 1302. Then a dielectric layer 1322 may be formed and patterned to allow an opening for the solder balls, such as the solder ball 1321. Alternatively, a metal layer 1318 may be sputtered upon the entire surface, filling the opening in the insulating layer 1322. Then the metal layer 1318 is patterned in the form shown in FIG. 19, and another insulating layer is deposited over the metal layer 1318. This insulating layer is then patterned to create an insulating layer 1316 and then another metal layer is deposited upon the surface and patterned to create the metal layer 1314. Finally, an insulating layer or other passivating layer is applied and patterned to create the insulating layer 1312 in order to complete the formation of the stop structure 1310.

Figure 20:
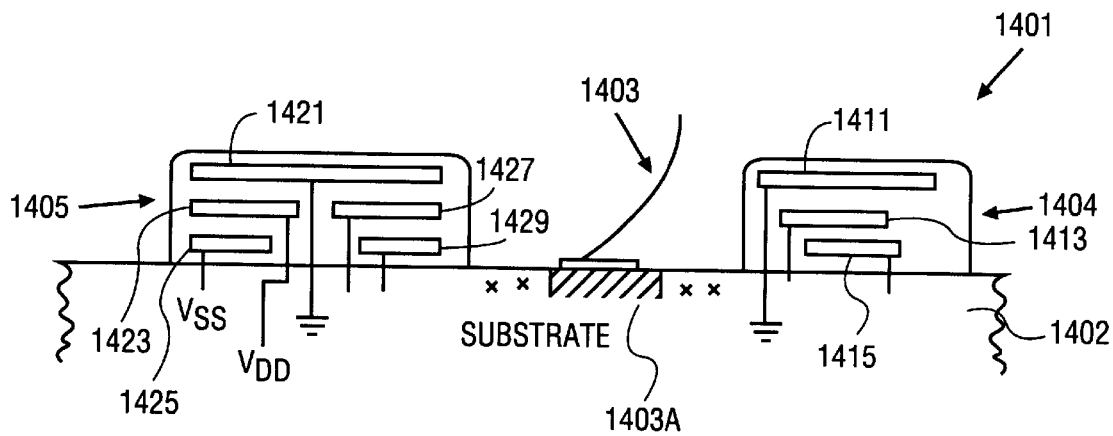
FIG. 20 illustrates two stop structures, each of which includes at least one circuit element according to one example of the present invention.

FIG. 20 shows another example of an interconnect assembly. This interconnect assembly 1401 includes two stop structures 1404 and 1405, each of which contain circuit elements which are coupled to electrical circuit elements in the substrate 1402. The substrate 1402 also includes a post or other contact element 1403A which is coupled mechanically and electrically to a resilient contact element 1403.

The stop structure 1404 includes a ground shield 1411 which is coupled to a ground bus or other circuit in the substrate 1402. As used herein, the term circuit element includes a ground shield or plane. Thus, a stop structure may include a ground shield in accordance with the present invention as shown in FIG. 20. The stop structure 1414 also includes a capacitor having conductive plates 1413 and 1415 which are coupled electrically to at least one circuit element in the substrate 1402.

The stop structure 1405 also includes a ground shield 1421 coupled electrically to a ground circuit in the substrate 1402. The stop structure 1405 also includes a capacitor formed by the conducting plates 1427 and 1429 which are electrically coupled to at least one circuit element in the substrate 1402. In addition, the stop structure 1405 includes conductive elements 1423 and 1425 which provide reference voltages, such as $V_{ss}$ and $V_{dd}$ which may be bussed through the stop structure to electrical components in the stop structure or to electrical components outside of the stop structure.

It will be appreciated that the foregoing description provides illustrative examples of the present invention and is not intended to provide an exhaustive list of the various materials or methods which may be used in creating the interconnect assemblies of the present invention. For example, while polyimide materials may be used to form the stop structures of the present invention, it will be appreciated that other materials may be used, including photoresist which are capable of producing high aspect ratios and which may be cured and left in place as a mechanical element, such as the photoresist SU8. Alternatively, a fill-cured epoxy sheet or polymeric materials or certain metals may also be used as the materials to create the stop structures. Indeed, the stop structure may be formed from any material which is stable at the desired temperatures to which the structure will be exposed, including testing and/or burn-in environments and the expected use environment. It is anticipated that the stop structures according to the present invention will have a minimum height of about 80 microns, although smaller height stop structures are within the scope of the present invention.

A general description of the device and method of using the present invention as well as a preferred embodiment of the present invention has been set forth above. One skilled in the art will recognize and be able to practice many changes in many aspects of the devices and methods described above, including variations which fall within the teachings of this invention. The spirit and scope of the invention should be limited only as set forth in the claims which follow.

What is claimed is:

1. A semiconductor device with an ancillary electronic component comprising:
   a semiconductor device including a first connection to a first electrical line and a second connection to a second electrical line; and
   an ancillary electronic component connected directly to a die surface of the semiconductor device and connected between the first connection and the second connection.

2. The semiconductor device of claim 1 further comprising connecting means for connecting the semiconductor device to a second electronic component, the connecting means providing clearance to accommodate the ancillary electronic component between the semiconductor device and the second electronic component.

3. The semiconductor device of claim 1 further comprising:
   a plurality of electrical contact elements connected to and extending a first distance from the semiconductor device;
   the ancillary electronic component extending from the semiconductor device a second distance, the second distance such that when the semiconductor device is connected to a corresponding second component, the ancillary electronic component will fit at least in part between the semiconductor device and the corresponding second component.

4. The semiconductor device of claim 3 wherein at least some of the plurality of electrical contact elements are composite, free-standing resilient contact structures and wherein said ancillary electronic component is a travel stop structure which defines a minimum separation between said semiconductor device and the corresponding second component.

5. The semiconductor device of claim 3 wherein at least some of the plurality of electrical contact elements are free-standing resilient contact structures primarily comprising a resilient material.

6. The semiconductor device as in claim 3 wherein said ancillary electronic component is selected from the group consisting of: (a) a capacitor; (b) a resistor; (c) an inductor; (d) a transistor; (e) a semiconductor integrated circuit; and wherein said semiconductor device comprises an integrated circuit.

7. The semiconductor device as in claim 6 wherein said ancillary electronic component is mounted directly on said semiconductor device.

8. An assembly comprising said semiconductor device as in claim 3 wherein said corresponding second component comprises another plurality of electrical contact elements connected to and extending a first distance from said corresponding second component, said another plurality of electrical contact elements for making electrical contact with said semiconductor device.

9. An assembly as in claim 8 wherein said corresponding second component comprises a printed circuit board.

10. An assembly as in claim 8 wherein said corresponding second component is arranged in a spaced apart relation to and generally parallel with said semiconductor device.

11. The semiconductor device of claim 1 further comprising:
- a second electronic component comprising in turn a plurality of electrical contact elements connected to and extending a first distance from the second electronic component, the plurality of electrical contact elements for connecting to the semiconductor device;
- the ancillary electronic component extending from the semiconductor device a second distance, the second distance such that when the semiconductor device is connected to the second electronic component, the ancillary electronic component will fit at least in part between the semiconductor device and the second electronic component.

12. The semiconductor device of claim 11 wherein at least some of the plurality of electrical contact elements are composite, free-standing resilient contact structures.

13. The semiconductor device of claim 11 wherein at least some of the plurality of electrical contact elements are free-standing resilient contact structures primarily comprising a resilient material.

14. The semiconductor device of claim 11 wherein the second electronic component is a printed circuit board.

15. The semiconductor device of claim 11 wherein the second electronic component is a socket.

16. The semiconductor device of claim 1 further comprising:
- a first terminal adjoining the die surface of the semiconductor device to connect to first circuitry of the semiconductor device;
- a second terminal adjoining the die surface of the semiconductor device to connect to second circuitry of the semiconductor device, and wherein the ancillary electronic component is electrically connected to the first terminal and the second terminal.

17. The semiconductor device of claim 16 wherein the ancillary electronic component is a capacitor.

18. The semiconductor device of claim 16 wherein the first circuitry is Vdd and the second circuitry is Vss, and the ancillary electronic component is a capacitor.

19. The semiconductor device of claim 16 wherein the second circuitry is ground.

20. The semiconductor device of claim 16 wherein the first circuitry is a first voltage level and the second circuitry is a second voltage level.

21. The semiconductor device of claim 20 wherein the first and second voltage levels are each selected from the group consisting of Vdd, VddA, VddB, Vss, VssA, VssB, Vref and ground.

22. The semiconductor device of claim 1 further comprising a plurality of such ancillary electronic components.

23. An assembly as in claim 1 wherein said ancillary electronic component comprises a travel stop structure which defines a minimum separation between a surface of said semiconductor device and another surface.

24. A semiconductor assembly comprising:
- a semiconductor integrated circuit (IC) having interconnection pads fabricated on a die surface of said semiconductor integrated circuit and having an insulating layer which exposes said interconnection pads; and
- a first circuit element in a structure attached to said die surface, said first circuit element being coupled electrically to a second circuit element in said semiconductor integrated circuit.

25. A semiconductor assembly as in claim 24 wherein said structure is a travel stop structure which defines a minimum separation, between said surface and a substrate having a contact element disposed on said substrate, in which said contact element is electrically coupled to said semiconductor integrated circuit.

26. A semiconductor assembly as in claim 25 wherein said first circuit element comprises a ground shield.

27. A semiconductor assembly as in claim 25 wherein said first circuit element comprises one of (a) a capacitor; (b) a resistor; (c) a driver circuit; (d) an inductor; (e) a shield; or (f) a routing trace.

28. A semiconductor assembly as in claim 25 wherein said structure comprises a multilayer structure which is formed after said semiconductor IC is created.

29. A semiconductor assembly as in claim 24 wherein said first circuit element comprises an insulated ground shield.

30. A semiconductor assembly as in claim 24 wherein said first circuit element comprises one of (a) a capacitor; (b) a resistor; (c) a driver circuit; (d) an inductor; (e) a shield; or (f) a routing trace.

31. A semiconductor assembly as in claim 24 wherein said structure comprises a multilayer structure which is formed after said interconnection pads and said insulating layer have been formed on said semiconductor IC.

32. An interconnect assembly comprising:
- a substrate;
- a resilient contact element having at least a portion thereof which is capable of moving to a first position in which said resilient contact element is in mechanical and electrical contact with another contact element, said resilient contact element being disposed on said substrate; and
- a stop structure disposed on said substrate, said stop structure defining said first position and containing a first circuit which is coupled to a second circuit on said substrate.

33. An interconnect assembly as in claim 32 wherein said another contact element is disposed on another substrate, and wherein said stop structure defines a separation between said substrate and said another substrate in which said resilient contact element is in mechanical and electrical contact with said another contact element.

34. An interconnect assembly as in claim 33 wherein said stop structure is disposed proximally adjacent to said resilient contact element on said substrate.

35. An interconnect assembly as in claim 33 wherein said resilient contact element comprises a spring structure.

36. An interconnect assembly comprising:
- a first substrate having a first surface with first contact elements;
- a second substrate having a second surface with second contact elements, said first surface facing said second surface and wherein a space exists between said first surface and said second surface;
- a plurality of free-standing resilient interconnect elements, each respectively electrically coupling a contact element of said first contact elements to a contact element of said second contact elements; and an electrical component attached to one of said first surface and said second surface and occupying at least a portion of said space and coupled to at least one contact element of said first contact elements or said second contact elements.

37. An interconnect assembly as in claim 36 wherein said first substrate comprises a semiconductor integrated circuit and wherein said plurality of interconnect elements are attached mechanically to at least one of said first substrate and said second substrate.

38. An interconnect assembly as in claim 37 wherein said second substrate comprises a printed circuit board and said electrical component is selected from the group consisting of (a) a capacitor; (b) a resistor; (c) an inductor; (d) a transistor; and (e) another semiconductor integrated circuit.

39. An interconnect assembly as in claim 38 wherein said plurality of interconnect elements comprise free-standing resilient contact structures.

40. An interconnect assembly as in claim 38 wherein said plurality of interconnect elements comprise ball structures.

41. An interconnect assembly as in claim 36 wherein said electrical component comprises a travel stop structure which defines a minimum separation between said first surface and said second surface.

* * * * *